(12) United States Patent
Arai et al.

(10) Patent No.: US 10,926,360 B2
(45) Date of Patent: Feb. 23, 2021

(54) LEAD-FREE SOLDER ALLOY, SOLDER JOINT, SOLDER PASTE COMPOSITION, ELECTRONIC CIRCUIT BOARD, AND ELECTRONIC DEVICE

(71) Applicant: TAMURA CORPORATION, Tokyo (JP)

(72) Inventors: Masaya Arai, Iruma (JP); Takeshi Nakano, Iruma (JP); Atsushi Hori, Iruma (JP); Tsukasa Katsuyama, Iruma (JP); Yurika Munekawa, Iruma (JP); Daisuke Maruyama, Iruma (JP)

(73) Assignee: TAMURA CORPORATION, Tokyo (JP)

( * ) Notice: Subject to any disclaimer, the term of this patent is extended or adjusted under 35 U.S.C. 154(b) by 229 days.

(21) Appl. No.: 15/709,424

(22) Filed: Sep. 19, 2017

(65) Prior Publication Data

US 2018/0029169 A1    Feb. 1, 2018

Related U.S. Application Data

(63) Continuation of application No. PCT/JP2017/011284, filed on Mar. 21, 2017.

(30) Foreign Application Priority Data

Mar. 22, 2016 (JP) ................................. 2016-057712
Sep. 20, 2016 (JP) ................................. 2016-182809
(Continued)

(51) Int. Cl.
*B23K 35/26* (2006.01)
*C22C 13/00* (2006.01)
(Continued)

(52) U.S. Cl.
CPC .......... *B23K 35/262* (2013.01); *B23K 35/025* (2013.01); *B23K 35/26* (2013.01);
(Continued)

(58) Field of Classification Search
CPC .... B23K 35/025; B23K 35/26; B23K 35/262; B23K 35/3618; C22C 13/00; C22C 13/02; H05K 1/092
(Continued)

(56) References Cited

U.S. PATENT DOCUMENTS

2003/0021718 A1* 1/2003 Munekata ............ B23K 1/0016
420/560
2003/0168123 A1    9/2003 Wada et al.
(Continued)

FOREIGN PATENT DOCUMENTS

CN    101801589    8/2010
CN    104870673    8/2015
(Continued)

OTHER PUBLICATIONS

English language machine translation of JP-2014065065-A to Arai et al. Generated Feb. 4, 2020. (Year: 2020).*
(Continued)

*Primary Examiner* — Brian D Walck
(74) *Attorney, Agent, or Firm* — Mori & Ward, LLP

(57) ABSTRACT

According to one aspect of the present invention, a lead-free solder alloy includes 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, and Sn.

17 Claims, 4 Drawing Sheets

(30) Foreign Application Priority Data

Nov. 17, 2016 (JP) ................................ 2016-224592
Jan. 31, 2017 (JP) ................................ 2017-015245

(51) Int. Cl.

| C22C 13/02 | (2006.01) |
| --- | --- |
| H01L 23/00 | (2006.01) |
| H05K 3/34 | (2006.01) |
| B23K 35/02 | (2006.01) |
| B23K 35/36 | (2006.01) |
| H05K 1/09 | (2006.01) |

(52) U.S. Cl.

CPC .......... *B23K 35/3618* (2013.01); *C22C 13/00* (2013.01); *C22C 13/02* (2013.01); *H01L 24/13* (2013.01); *H05K 1/092* (2013.01); *H05K 3/3457* (2013.01); *H01L 24/16* (2013.01); *H01L 24/81* (2013.01); *H01L 2224/0401* (2013.01); *H01L 2224/1132* (2013.01); *H01L 2224/11332* (2013.01); *H01L 2224/13294* (2013.01); *H01L 2224/16227* (2013.01); *H01L 2224/81192* (2013.01); *H01L 2224/81815* (2013.01); *H01L 2924/3512* (2013.01); *H05K 3/3494* (2013.01); *H05K 2201/10727* (2013.01); *H05K 2201/2045* (2013.01)

(58) Field of Classification Search

USPC .............. 148/23, 24; 403/272; 420/560, 561
See application file for complete search history.

(56) References Cited

U.S. PATENT DOCUMENTS

| 2007/0036671 | A1* | 2/2007 | Albrecht | ............ | B23K 35/262 |
| --- | --- | --- | --- | --- | --- |
| | | | | | 420/561 |
| 2014/0054766 | A1 | 2/2014 | Hashino et al. | | |
| 2015/0305167 | A1* | 10/2015 | Nakanishi | ............... | C22C 13/00 |
| | | | | | 174/257 |
| 2016/0056570 | A1* | 2/2016 | Yoshikawa | ............ | H01R 4/02 |
| | | | | | 174/257 |
| 2016/0279741 | A1 | 9/2016 | Ukyo et al. | | |
| 2016/0325384 | A1 | 11/2016 | Liu et al. | | |
| 2016/0368104 | A1 | 12/2016 | Irisawa et al. | | |
| 2017/0014955 | A1 | 1/2017 | Ueshima et al. | | |

FOREIGN PATENT DOCUMENTS

| CN | 105142856 | | 12/2015 | | |
| --- | --- | --- | --- | --- | --- |
| CN | 106001978 | | 10/2016 | | |
| CN | 108500499 | B | 9/2018 | | |
| EP | 2578350 | | 4/2013 | | |
| EP | 2689885 | | 1/2014 | | |
| EP | 2868424 | | 5/2015 | | |
| EP | 2875898 | | 5/2015 | | |
| JP | 05-228685 | | 9/1993 | | |
| JP | 09-326554 | | 12/1997 | | |
| JP | 10-286689 | | 10/1998 | | |
| JP | 3353640 | B2 | 10/1998 | | |
| JP | 2000-190090 | | 7/2000 | | |
| JP | 2000-349433 | | 12/2000 | | |
| JP | 2003-260589 | | 9/2003 | | |
| JP | 2008-028413 | | 2/2008 | | |
| JP | WO2009/011341 | | 1/2009 | | |
| JP | 2009-28746 | | 2/2009 | | |
| JP | 4787384 | B1 | 10/2011 | | |
| JP | WO2011/151894 | | 12/2011 | | |
| JP | 2012-81521 | | 4/2012 | | |
| JP | 2012-106280 | | 6/2012 | | |
| JP | 5324007 | B1 | 10/2013 | | |
| JP | 2013-252548 | | 12/2013 | | |
| JP | 2014-027122 | | 2/2014 | | |
| JP | 2014-36985 | | 2/2014 | | |
| JP | 2014-37005 | | 2/2014 | | |
| JP | 2014-54663 | | 3/2014 | | |
| JP | 2014-65065 | | 4/2014 | | |
| JP | 2014065065 | A * | 4/2014 | | |
| JP | 2015-77601 | | 4/2015 | | |
| JP | WO2015/125855 | | 8/2015 | | |
| JP | 5811304 | B2 | 11/2015 | | |
| JP | 2016-026879 | | 2/2016 | | |
| JP | 2016-179498 | | 10/2016 | | |
| JP | 6200534 | B2 | 10/2016 | | |
| JP | 6047254 | B1 | 12/2016 | | |
| JP | 6053248 | B1 | 12/2016 | | |
| JP | 6125084 | B1 | 5/2017 | | |
| JP | 2017-143196 | | 8/2017 | | |
| JP | 2017-170465 | | 9/2017 | | |
| JP | 2018-030176 | | 3/2018 | | |
| WO | WO 2011/102034 | | 8/2011 | | |
| WO | WO 2014/163167 | | 10/2014 | | |
| WO | WO-2014163167 | A1 * | 10/2014 | ............. | B23K 35/26 |
| WO | WO 2015/115483 | | 8/2015 | | |
| WO | WO 2015/152387 | | 10/2015 | | |
| WO | WO 2017/018167 | | 2/2017 | | |

OTHER PUBLICATIONS

Unpublished JP Application No. 2015-146520 filed in JPO on Jul. 24, 2015.
Japanese Office Action for corresponding JP Application No. 2016-057712, dated Jul. 15, 2016 (w/ English machine translation).
Japanese Office Action for corresponding JP Application No. 2016-182809, dated Jun. 1, 2017 (w/ English machine translation).
Japanese Office Action for corresponding JP Application No. 2016-224592, dated Feb. 3, 2017 (w/ English machine translation).
Japanese Office Action for corresponding JP Application No. 2017-073646, dated Jun. 1, 2017 (w/ English machine translation).
Japanese Office Action for corresponding JP Application No. 2017-073646, dated Jul. 20, 2017 (w/ English machine translation).
Written Patent Opposition to JP Patent No. 6047254, dated Jun. 19, 2017 (w/ English translation).
International Search Report for corresponding International Application No. PCT/JP2017/011284, dated Jun. 20, 2017.
European Patent Office Communication for corresponding EP Application No. 17770236.2-1103, dated Jun. 3, 2019.
Korean Office Action for corresponding KR Application No. 10-2018-7000028, dated Jun. 5, 2019 (w/ machine translation).
Chinese Office Action for corresponding CN Application No. 201610154029.4, dated Dec. 3, 2018.
Li et al., "Effect of the microelements on the oxidation-resistance of Sn—0.7Cu lead-free solder", Electronic Components and Materials, Nov. 2017, vol. 26 No. 11.
Chinese Office Action for corresponding CN Application No. 201810286715.6, dated Dec. 5, 2018.
Japanese Office Action for corresponding JP Application No. 2017-015245, dated Jan. 29, 2019 (w/ machine translation).
International Search Report for corresponding International Application No. PCT/JP2017/033364, dated Dec. 12, 2017.
Written Patent Opposition filed in the corresponding JP Patent No. 6125084, dated Nov. 8, 2017.
Notice of Reasons for Revocation of Patent issued by the Japan Patent Office for corresponding JP Patent. No. 6125084 (Opposition No. 2017-701039), dated Jan. 19, 2018.
Communication Pursuant to Article 94(3) EPC for corresponding EP Application No. 1777.239.2-1103, dated Feb. 11, 2019.
Chinese Office Action with Search Report for corresponding CN Application No. 201780001047.1, dated Mar. 1, 2019.
Yang et al., "Electronic Process Basics and Practices", Nov. 30, 2012, pp. 147-148, South China University of Technology Press (w/ partial English translation).
Translation of Written Opinion of the International Searching Authority for corresponding International Application No. PCT/JP2017/033364, dated Feb. 22, 2019.
Japanese Office Action for corresponding JP Application No. 2016-038976, dated Jan. 19, 2017 (w/ English machine translation).

(56) References Cited

OTHER PUBLICATIONS

Japanese Office Action for corresponding JP Application No. 2016-038976, dated Apr. 25, 2017 (w/ English machine translation).
Office Action issued by the United States Patent and Trademark Office for the co-pending U.S. Appl. No. 15/073,570, dated Apr. 2, 2018.
Japanese Office Action for JP Application No. 2016-057713, dated Sep. 26, 2017 (w/ English machine translation).
Written Opinion for corresponding International Application No. PCT/JP2017/033364, dated Dec. 12, 2017.
Office Action with Form PTO-892 Notice of References Cited issued by the United States Patent and Trademark Office for the co-pending U.S. Appl. No. 15/698,650, dated Apr. 18, 2018.
Extended European Search Report for corresponding EP Application No. 17770236.2-1103, dated Jul. 20, 2018.
Translation of Written Opinion of the International Searching Authority for corresponding International Application No. PCT/JP2017/011284, dated Jun. 20, 2017.
Japanese Office Action for JP Application No. 2017-199948, dated Nov. 7, 2017 (w/ English machine translation).
Japanese Office Action for corresponding JP Application No. 2017-199949, dated Aug. 30, 2018 (w/ English machine translation).
Japanese Office Action for corresponding JP Application No. 2017-015245, dated Sep. 10, 2018 (w/ English machine translation).
Japanese Office Action for corresponding JP Application No. 2017-201023, dated Aug. 29, 2018 (w/ English machine translation).
Communication Pursuant to Rule 114(2) EPC for corresponding EP Application No. 17770236.2-1103, dated Oct. 5, 2018.
Chinese Office Action for corresponding CN Application No. 201810286715.6, dated May 8, 2019.
Submission of publication etc. for corresponding JP Application No. 2016-038976, dated Jan. 26, 2017.
Korean Office Action for corresponding KR Application No. 10-2018-7000900, dated Apr. 11, 2018 (w/ English machine translation).
Advisory Action issued by the United States Patent and Trademark Office for the co-pending U.S. Appl. No. 15/073,570, dated Nov. 23, 2018.
Advisory Action issued by the United States Patent and Trademark Office for the co-pending U.S. Appl. No. 15/698,650, dated Nov. 23, 2018.
Extended European Search Report for corresponding EP Application No. 17910490.6-1108, dated Jul. 24, 2019.
Chinese Office Action for corresponding CN Application No. 201610154029.4, dated Jul. 5, 2019.
Notice of Reasons for Revocation of Patent issued by the Japan Patent Office for corresponding JP Patent No. 6047254 (Opposition No. 2017-700619), dated Sep. 22, 2017.
Office Action issued by the United States Patent and Trademark Office for the co-pending U.S. Appl. No. 15/073,570, dated Sep. 13, 2018.
Office Action with Form PTO-892 Notice of References Cited issued by the United States Patent and Trademark Office for the co-pending U.S. Appl. No. 15/698,650, dated Sep. 13, 2018.
Office Action with Form PTO-892 Notice of References Cited issued by the U.S. Patent and Trademark Office for the co-pending U.S. Appl. No. 15/073,570, dated Mar. 11, 2019.
Notice of Allowance issued by the United States Patent and Trademark Office for the co-pending U.S. Appl. No. 15/695,650, dated Mar. 13, 2019.
Japanese Office Action for corresponding JP Application No. 2017-700619, dated Sep. 22, 2017.
Third Party Observation for corresponding International Application No. PCT/JP2017/011284, Oct. 25, 2017.
Chinese Office Action for corresponding CN Application No. 201780001047.1, dated Oct. 8, 2019.
Advisory Action issued by the United States Patent and Trademark Office for the co-pending U.S. Appl. No. 15/073,570, dated Nov. 6, 2019.
Office Action with Form PTO-892 Notice of References Cited issued by the United States Patent and Trademark Office for the co-pending U.S. Appl. No. 15/073,570, dated Sep. 6, 2019.
Chinese Office Action for corresponding CN Application No. 201710826844.5, dated Jun. 23, 2020 (w/ machine translation).
Philippines Office Action for corresponding PH Application No. 1/2018/500431, dated Jun. 30, 2020.
Office Action issued by the United States Patent and Trademark Office for the co-pending U.S. Appl. No. 15/073,570, dated Jan. 8, 2020.
Judgment on Feb. 14, 2018, Intellectual Property High Court Judgment on the Decision of Cancellation of the Decision, Decision No. 10121 of 2017, (w/partial translation of relevant portion).
Japanese Office Action for corresponding JP Application No. 2017-143140, dated Feb. 26, 2020 (w/ machine translation).
Chinese Office Action for corresponding CN Application No. 201780001047.1, dated Mar. 19, 2020 (w/ machine translation).
European Patent Office Communication for corresponding EP Application No. 17910490.6-1108, dated Mar. 4, 2020.
Written Patent Opposition for corresponding JP Patent No. 6467484, dated Aug. 8, 2019.
Japanese Office Action for corresponding JP Application No. 2019-003004, dated May 26, 2020 (w/ machine translation).
Thailand Office Action for corresponding TH Application No. 1801005627 PCT, dated Jul. 28, 2020.

\* cited by examiner

LEAD-FREE SOLDER ALLOY, SOLDER JOINT, SOLDER PASTE COMPOSITION, ELECTRONIC CIRCUIT BOARD, AND ELECTRONIC DEVICE

CROSS-REFERENCE TO RELATED APPLICATIONS

The present application is a continuation application of International Application No. PCT/JP2017/011284, filed Mar. 21, 2017, entitled "LEAD-FREE SOLDER ALLOY, ELECTRONIC CIRCUIT BOARD, AND ELECTRONIC CONTROLLER", which claims priority to Japanese Patent Application No. 2016-057712, filed Mar. 22, 2016, Japanese Patent Application No. 2016-182809, filed Sep. 20, 2016, Japanese Patent Application No. 2016-224592, filed Nov. 17, 2016, and Japanese Patent Application No. 2017-015245, filed Jan. 31, 2017. The contents of these applications are incorporated herein by references in their entirety.

BACKGROUND OF THE INVENTION

Field of the Invention

The present disclosure relates to a lead-free solder alloy, a solder joint, a solder paste composition, and an electronic circuit board, and an electronic device.

In the related art, when electronic components are bonded to electronic circuits formed on substrates such as printed circuit boards and silicon wafers, a solder bonding method using a solder alloy is used. This solder alloy is commonly lead. However, since the use of lead is restricted by RoHS and other directions from the viewpoint of environmental load, a solder bonding method using a so-called lead-free solder alloy is becoming common in recent years.

Examples of well-known lead-free solder alloys include Sn—Cu, Sn—Ag—Cu, Sn—Bi, and Sn—Zn solder alloys. Among them, the Sn-3Ag-0.5Cu solder alloy is often used in consumer-electronic appliances included in televisions and mobile phones, and in-car electronic appliances mounted in automobiles.

Lead-free solder alloys have rather lower solderability than lead-containing solder alloys, but the problem of solderability has been solved by the improvements in flux and soldering apparatuses. Therefore, for example, solder joints formed using the Sn-3Ag-0.5Cu solder alloy have caused no serious problem in in-car electronic circuit boards placed in relatively moderate environments with some temperature variations, such as automobile interiors.

However, in recent years, studied and commercialized are the installment of electronic circuit boards, such as those used in electronic controllers, in severe environments subjected to extreme temperature variations (for example, temperature variations from −30° C. to 110° C., from −40° C. to 125° C., and from −40° C. to 150° C.) and vibration loads, such as direct mounting in engine compartments and engines, or mechatronical integration with motors.

In these environments with extreme temperature variations, heat displacement of solder joints and accompanying stress tend to occur because of the difference in the coefficient of linear expansion of the mounted electronic components and the substrate. The repetition of plastic deformation by the temperature difference tends to cause cracking in the solder joints, and the stress repeatedly applied along with the lapse of the time concentrates in the vicinity of the ends of the cracks, and thus the cracks readily and horizontally develop to the deep portion of the solder joints. These markedly developed cracks can break the electrical connection between the electronic components and the electronic circuit formed on the substrate. The cracks and their development more readily occur particularly in the environments subjected to extreme temperature variations and vibration loads on the electronic circuit board.

Therefore, with the increase of in-car electronic circuit boards and electronic controllers placed in the above-described severe environments, the demands for Sn—Ag—Cu solder alloys having sufficient crack development suppressing effect, and solder paste compositions including the same will increasingly grow.

In related art, Ni/Pd/Au-plated or Ni/Au-plated components have been frequently used in the lead portions of electronic components such as QFP (Quad Flat Package) and SOP (Small Outline Package) mounted on in-car electronic circuit boards. However, with the cost reduction of electronic components and downsizing of substrates in recent years, studied and commercialized are the electronic components including Sn plating in place of lead portions, and the electronic components having Sn-plated lower electrodes.

In solder bonding, the Sn-plated electronic components readily cause mutual diffusion between Sn plating, Sn contained in the solder joints, and Cu contained in the Cu contained in the lead portions and the lower electrodes. This mutual diffusion markedly grows the $Cu_3Sn$ layer, which is an intermetallic compound, in an uneven state, in the region near the interface between the solder joints, lead portions, and lower electrode (hereinafter referred to as "in the vicinity of interfaces" in the present description). The $Cu_3Sn$ layer is intrinsically hard and brittle, and the greatly grown $Cu_3Sn$ layer in an uneven state is more brittle. Therefore, in the severe environment, cracks more readily occur near the interface than in the solder joints, and the cracks develop at once from the origin, so that electrical short circuit tends to occur.

Accordingly, in the future, the demands for lead-free solder alloys exerting crack development suppressing effect in the vicinity of interfaces are expected to grow, even in the cases where electronic components without Ni/Pd/Au plating or Ni/Au plating are used in the above-described severe environments.

There are several disclosures about the methods for preventing crack development in solder joints by adding an element such as Ag or Bi to the Sn—Ag—Cu solder alloy to improve the strength of the solder joints and accompanying thermal fatigue properties (see JP 1993-228685 A, JP 1997-326554 A, JP 2000-190090 A, JP 2000-349433 A, JP 2008-28413 A, WO 2009/011341 A, and JP 2012-81521 A).

SUMMARY

According to one aspect of the present invention, a lead-free solder alloy includes 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, and Sn.

According to another aspect of the present invention, a lead-free solder alloy includes 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, 0.001% by mass or more and 0.25% by mass or less of Co, and Sn. Inequalities (A) to (D) in terms of % by weight are satisfied.

$$1.6 \leq \text{an amount of Ag} + (\text{an amount of Cu}/0.5) \leq 5.9 \quad (A)$$

$$0.85 \leq (\text{an amount of Ag}/3) + (\text{an amount of Bi}/4.5) \leq 2.10 \quad (B)$$

$$3.6 \leq \text{an amount of Ag} + \text{an amount of Sb} \leq 8.9 \quad (C)$$

$$0 < (\text{an amount of Ni}/0.25) + (\text{an amount of Co}/0.25) \leq 1.19 \quad (D).$$

According to further aspect of the present invention, a solder joint electrically connects a first electrode and a second electrode with a lead-free solder alloy. The lead-free solder alloy includes 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, and Sn.

According to further aspect of the present invention, a lead-free solder alloy consists of 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, Sn, and unavoidable impurities.

According to further aspect of the present invention, a lead-free solder alloy consists of 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, Sn, 0.001% by mass or more and 0.25% by mass or less of Co, and unavoidable impurities.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
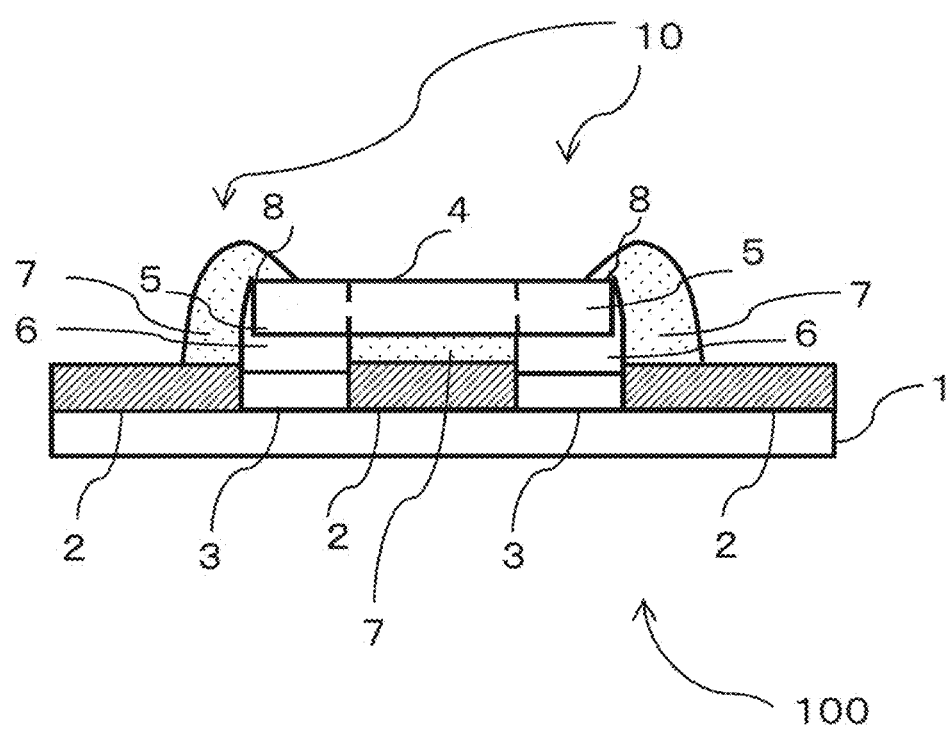
FIG. 1 is a partial cross sectional view showing a part of the electronic circuit board according to one embodiment of the present invention.
Figure 2:
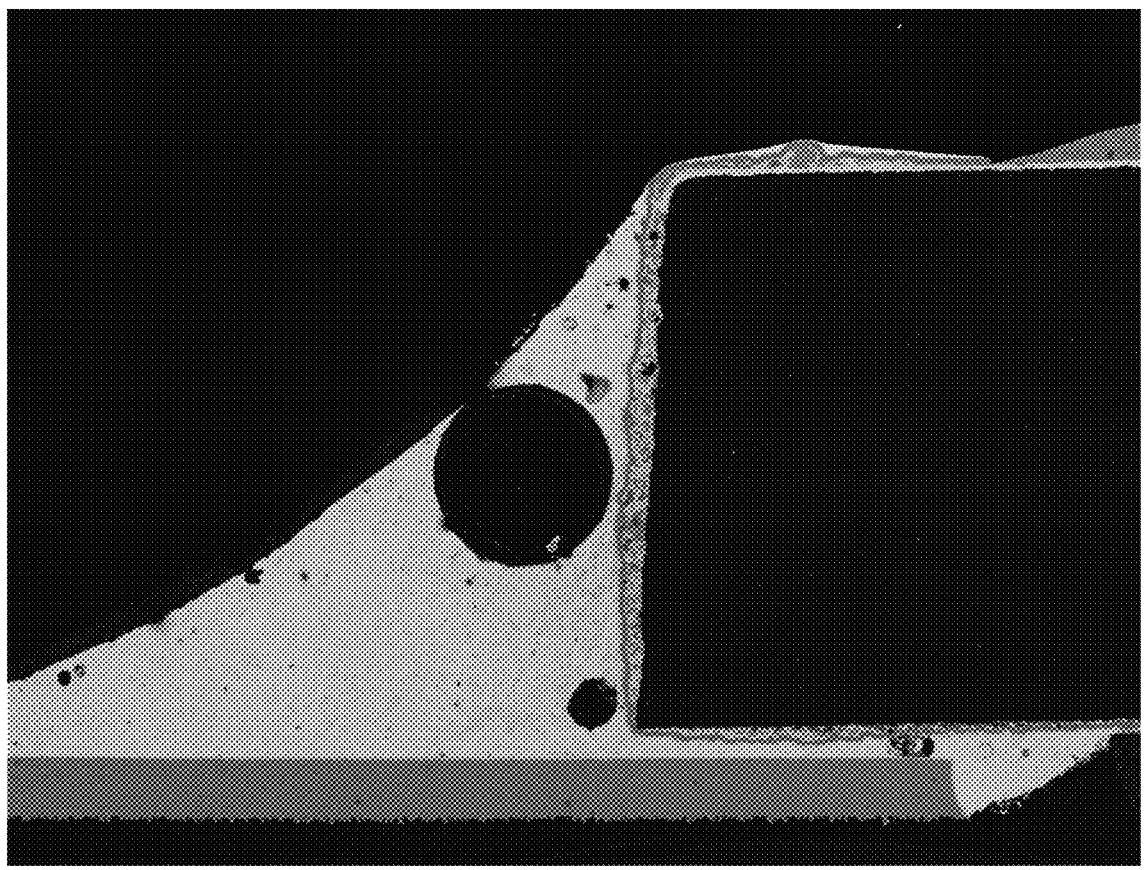
FIG. 2 is an electron micrograph showing the cross section having voids in the fillet part of a chip component in a test substrate according to Comparative Example of the present invention.

Embodiments of the lead-free solder alloy, solder paste composition, and electronic circuit board, and electronic device of the present invention are described below in detail. Not that the invention is not limited to the following embodiments.

(1) Lead-Free Solder Alloy

The lead-free solder alloy of the present embodiment may contain 1% by mass or more and 3.1% by mass or less of Ag. The addition of Ag within this range precipitates an $Ag_3Sn$ compound in the Sn grain boundaries of the lead-free solder alloy, and imparts mechanical strength.

However, if the Ag content is less than 1% by mass, precipitation of the $Ag_3Sn$ compound is little, and the mechanical strength and heat shock resistance of the lead-free solder alloy decrease. In addition, if the Ag content is more than 3.1% by mass, the tensile strength will not be markedly improved, and dramatic improvement of thermal fatigue-resistant properties will not occur. In addition, the increase in the amount of costly Ag is economically unfavorable. Furthermore, if the Ag content is more than 4% by mass, drawability of the lead-free solder alloy is inhibited, and the solder joints formed using this may cause electrode peeling phenomenon in the electronic components.

When the Ag content is 2% by mass or more and 3.1% by mass or less, the balance between the strength and drawability of the lead-free solder alloy is more improved. The Ag content is even more preferably 2.5% by mass or more and 3.1% by mass or less.

The lead-free solder alloy of the present embodiment may contain more than 0% by mass and 1% by mass or less of Cu. When the Cu content is within this range, Cu erosion suppressing effect is exerted on Cu lands on the electronic circuit, and precipitation of the $Cu_6Sn_5$ compound at Sn grain boundaries improve heat shock resistance of the lead-free solder alloy.

When the Cu content is 0.5% or more and 1% by mass or less, good Cu erosion suppressing effect is exerted. In particular, when the Cu content is 0.7% by mass or less, Cu erosion suppressing effect is exerted on Cu lands, and the viscosity of the lead-free solder alloy during melting is kept in good condition, whereby occurrence of voids during reflowing is more reduced, and heat shock resistance of the solder joint to be formed is improved. Furthermore, dispersion of fine $Cu_6Sn_5$ in the Sn grain boundaries of the molten lead-free solder alloy suppresses the change in the crystal orientation of Sn, and thus suppresses the deformation of the solder bonding shape (fillet shape).

If the Cu content is more than 1% by mass, the $Cu_6Sn_5$ compound readily precipitates in the solder joints in the vicinity of the interface between the electronic components and electronic circuit board, and reliability of bonding and drawability of the solder joints may be inhibited.

In common solder joints formed using a lead-free solder alloy containing Sn, Ag, and Cu, an intermetallic compound (for example, $Ag_3Sn$ or $Cu_6Sn_5$) is dispersed at the interfaces between Sn particles, and this structure prevents the phenomenon of sliding and deformation of Sn particles even when a tensile force is applied to the solder joints, whereby so-called mechanical properties can be expressed. More specifically, the intermetallic compound prevents slipping of Sn particles.

Accordingly, in the lead-free solder alloy, when the Ag content is 1% by mass or more and 3.1% by mass or less, the Cu content is more than 0% by mass and 1% by mass or less, and the Ag content is not less than the Cu content, $Ag_3Sn$ as the intermetallic compound is readily formed, and good mechanical properties can be expressed, even if the Cu content is relatively low. More specifically, even if the Cu content is 1% by mass or less, it contributes to prevention of slipping of $Ag_3Sn$ while partially turning to an intermetallic compound, so that good mechanical properties are likely exerted in both of $Ag_3Sn$ and Cu.

The lead-free solder alloy of the present embodiment may contain 1% by mass or more and 5% by mass or less of Sb. When the Sb content is within this range, crack development suppressing effect of the solder joint is improved, without inhibiting drawability of the Sn—Ag—Cu solder alloy. In order to further improve the crack development suppressing effect, the Sb content is preferably 2% by mass or more and 4% by mass or less.

In order to resist the external stress caused by exposure to severe environments with extreme temperature variations for a long time, the increase in toughness of the lead-free solder alloy (the area size surrounded by the stress-strain curve), improvement in drawability, and solid-solution strengthening by the addition of an element soluble in the Sn matrix are considered effective. Sb is an optimum element for the solid-solution strengthening of the lead-free solder alloy while ensuring sufficient toughness and drawability.

More specifically, when Sn is added to the lead-free solder alloy whose base material is substantially Sn (the major components of the lead-free alloy are referred herein. Hereinafter the same shall apply) within the above-described range, the crystal lattice of Sn is partially substituted with Sb, and the crystal lattice is strained. Therefore, in the solder joints formed using the lead-free solder alloy, the partial substitution of the Sn crystal lattice by Sb increases the energy required for the transfer in the crystal, and reinforces its metal tissues. Furthermore, the precipitation of the fine SnSb, and $\varepsilon$-$Ag_3$(Sn,Sb) compounds in the Sn grain boundaries prevent slipping deformation of the Sn grain boundaries, thus suppressing crack development in the solder joints.

In comparison with the Sn-3Ag-0.5Cu solder alloy, Sn crystals keep a fine state in the tissue of the solder joints formed using the lead-free solder alloy containing Sb in the above-described range even after exposure to severe environments with extreme temperature variations for a long time, indicating that the structure is resistant to crack development. The reason is likely that the SnSb and $\varepsilon$-$Ag_3$(Sn,Sb) compound precipitated at the Sn grain boundaries are finely dispersed in the solder joints even after exposure to a severe environment with extreme temperature variations for a long time, whereby coarsening of Sn crystals is suppressed. More specifically, the solder joints using the lead-free solder alloy containing Sb within the above-described range maintains marked thermal shock resistance even after exposure to a severe environment having extreme temperature variations for a long time, likely because dissolution of Sb in the Sn matrix occurs at high temperatures, and precipitation of SnSb and the $\varepsilon$-$Ag_3$(Sn,Sb) compound occurs at low temperatures, and thus solid-solution strengthening at high temperatures and precipitation strengthening at low temperatures are repeated.

Furthermore, the lead-free solder alloy containing Sb within the above-described range can improve its strength without decreasing drawability in comparison with the Sn-3Ag-0.5Cu solder alloy, and thus maintains sufficient toughness to external stress, and relaxes the residual stress. When a solder joint formed using a solder alloy having low drawability is placed in an environment having extreme temperature variations, repeatedly generating stresses tend to accumulate at the electronic components side of the solder joint. Therefore, deep part cracks often occur in the solder joints in the vicinity of electrodes of electronic components. As a result of this, stresses concentrate on the electrodes of the electronic components in the vicinity of cracks, and the solder joints can peel the electrodes at the electronic components side. However, the solder alloy of the present embodiment contains Sb within the above-described range, so that its drawability is hardly inhibited even Bi or other element which can affect drawability of the solder alloy, whereby the electrode peeling phenomenon of the electronic components is prevented even when exposed to the above-described severe environment for a long time.

However, if the Sb content is more than 5% by mass, the melting temperature (solidus temperature-liquidus temperature) of the lead-free solder alloy increases, which hinders redissolution of Sb at high temperatures. Therefore, when exposed to a severe environment having extreme temperature variations for a long time, only precipitation strengthening by SnSb and the $\varepsilon$-$Ag_3$(Sn,Sb) compound occurs, so that these intermetallic compounds are coarsened with the lapse of time, and the suppressing effect on slipping deformation of Sn grain boundaries vanishes. In addition, in this case, the heat resistant temperature of the electronic components can become a problem with the increase in the melting temperature of the lead-free solder alloy.

The lead-free solder alloy of the present embodiment may contain 0.5% by mass or more and 4.5% by mass or less of Bi. According to the composition of the lead-free solder alloy of the present embodiment, when the Bi content is within this range, the strength of the lead-free solder alloy is improved without affecting its drawability, and the melting temperature increased by the addition of Sb is decreased. More specifically, since Bi dissolves in the Sn matrix like Sb, it further reinforces the lead-free solder alloy. However, if the Bi content is more than 4.5% by mass, drawability of the lead-free solder alloy decreases and its brittleness increases, so that deep cracks readily occur in the solder joints formed using the lead-free solder alloy when exposed to severe environments with extreme temperature variations for a long time.

When the Bi content is 2% by mass or more and 4.5% by mass or less, the strength of the solder joints is improved. In addition, when it is used in combination with the below-described Ni and/or Co, the Bi content is preferably 3.1% by mass or more and 4.5% by mass or less.

The lead-free solder alloy of the present embodiment may contain 0.01% by mass or more and 0.25% by mass or less of Ni. According to the composition of the lead-free solder alloy of the present embodiment, when the Ni content is within this range, $(Cu,Ni)_6Sn_5$ is finely formed in the molten lead-free solder alloy and dispersed in the base material, whereby crack development in the solder joints is suppressed, and the thermal fatigue-resistant properties are improved.

In addition, the lead-free solder alloy of the present embodiment forms fine $(Cu,Ni)_6Sn_5$ because Ni moves to the vicinity of interfaces at the time of solder bonding even when electronic components having no Ni/Pd/Au plating or Ni/Au plating are solder-joined, whereby the growth of the $Cu_3Sn$ layer in the vicinity of interfaces is suppressed, and the crack development suppressing effect in the vicinity of interfaces is improved.

However, if the Ni content is less than 0.01% by mass, the reforming effect of the intermetallic compound is insufficiently achieved, so that the crack suppressing effect in the vicinity of interfaces cannot be sufficiently achieved. In addition, if the Ni content is more than 0.25% by mass, supercooling is difficult to occur in comparison with related art Sn-3Ag-0.5Cu alloy, whereby coagulation of the solder alloy is hastened. Therefore, it was confirmed that the gas getting out during melting of the solder alloy was coagulated in the fillets of the solder joints, and voids were developed by the gas occurred in the fillets. The voids in the fillets should be alloy portions, so that the thermal fatigue-resistant properties of the solder joints can deteriorate particularly in environments having extreme temperature variations from −40° C. to 140° C., and from −40° C. to 150° C., and cracks tend to develop because of the voids.

As described above, Ni readily develops voids in the fillets, but in the composition of the lead-free solder alloy of the present embodiment, owing to the balance between Ni and other elements, the occurrence of voids is suppressed even when the Ni content is 0.25% by mass or less.

In addition, when the Ni content is 0.01% by mass or more and 0.15% by mass or less, the occurrence of voids is more suppressed, while good crack development suppressing effect and thermal fatigue-resistant properties near the interface are improved.

The lead-free solder alloy of the present embodiment may contain, in addition to Ni, 0.001% by mass or more and 0.25% by mass or less of Co. When the lead-free solder alloy has the composition of the present embodiment, the Co content within this range enhances the above-described effect by the Ni addition, and forms fine $(Cu,Co)_6Sn_5$ in the molten lead-free solder alloy and dispersed in the base material, whereby the thermal fatigue-resistant properties of the solder joints are improved even in environments with severe temperature variations, while creep deformation of solder joints and crack development are suppressed. In addition, since the lead-free solder alloy of the present embodiment enhances the above-described effect by the Ni addition and Co moves to the vicinity of interfaces at the time of solder bonding to form fine $(Cu,Ni)_6Sn_5$ even when electronic components having no Ni/Pd/Au plating or Ni/Au plating are solder-joined, the growth of the $Cu_3Sn$ layer in the vicinity of interfaces is suppressed, and the crack development suppressing effect in the vicinity of interfaces is improved.

However, if the Co content is less than 0.001% by mass, the reforming effect on the intermetallic compound is insufficient, so that the crack suppressing effect in the vicinity of interfaces tends to be insufficient. In addition, if the Co content is more than 0.25% by mass, supercooling is difficult to occur in comparison with related art Sn-3Ag-0.5Cu alloy, whereby coagulation of the solder alloy is hastened. Therefore, it was confirmed that the gas getting out during melting of the solder alloy was coagulated in the fillets of the solder joints, and voids were developed by the gas occurred in the fillets. The voids in the fillets should be alloy portions, so that the thermal fatigue-resistant properties of the solder joints can deteriorate particularly in environments having extreme temperature variations from −40° C. to 140° C., and from −40° C. to 150° C., and cracks tend to develop because of the voids.

As described above, Co readily develops voids in the fillets, but in the composition of the lead-free solder alloy of the present embodiment, owing to the balance between Co and other elements, the occurrence of voids is suppressed even when the Co content is 0.25% by mass or less.

When the Co content is more than 0.001% by mass or more and 0.15% by mass or less, the occurrence of voids is more suppressed, while good crack development suppressing effect and thermal fatigue-resistant properties are improved.

When the lead-free solder alloy of the present embodiment contains Ni and Co, the Ag, Cu, Sb, Bi, Ni, and Co contents (% by mass) preferably satisfy all of the following formulae (A) to (D):

$$1.6 \leq \text{the amount of Ag} + (\text{the amount of Cu}/0.5) \leq 5.9 \quad (A)$$

$$0.85 \leq (\text{the amount of Ag}/3) + (\text{the amount of Bi}/4.5) \leq 2.10 \quad (B)$$

$$3.6 \leq \text{the amount of Ag} + \text{the amount of Sb} \leq 8.9 \quad (C)$$

$$0 < (\text{the amount of Ni}/0.25) + (\text{the amount of Co}/0.25) \leq 1.19 \quad (D).$$

When the amount of Ag, Cu, Sb, Bi, Ni, and Co are within these ranges, suppression of inhibition of drawability and increase in brittleness of solder joints, improvements in strength of solder joints and thermal fatigue properties, suppression of void development in the fillet, suppression of crack development in solder joints in severe environments with extreme temperature variations, and crack development suppressing effect in the vicinity of interfaces during solder bonding of electronic components without Ni/Pd/Au plating or Ni/Au plating are achieved in a well-balanced manner, whereby reliability of the solder joint is further improved.

In addition, the lead-free solder alloy of the present embodiment may contain more than 0% by mass and 6% by mass or less of In. When the In content is within this range, the melting temperature of the lead-free solder alloy increased by the addition of Sb is decreased, and crack development suppressing effect is improved. More specifically, In dissolves in the Sn matrix like Sb, and thus further reinforces the lead-free solder alloy, and forms the AgSnIn and InSb compounds and precipitates them at the Sn grain boundaries, thereby suppressing slipping deformation of the Sn grain boundaries.

It is not preferred that the In content be more than 6% by mass in the solder alloy of the present embodiment, because it inhibits drawability of the lead-free solder alloy, and forms $\gamma$-$InSn_4$ to cause self deformation of the lead-free solder alloy during exposure to severe environments with extreme temperature variations for a long time.

The In content is more preferably more than 0% by mass and 4% by mass or less, and particularly preferably 1% by mass or more and 2% by mass or less.

The lead-free solder alloy of the present embodiment may contain at least one of P, Ga, and Ge in a total amount of 0.001% by mass or more and 0.05% by mass or less. When at least one of P, Ga, and Ge is added within this range of the total amount, oxidation of the lead-free solder alloy is prevented. However, it is not preferred that the total amount be more than 0.05% by mass, because it increases the melting temperature of the lead-free solder alloy, and readily develop voids in the solder joints.

Furthermore, the lead-free solder alloy of the present embodiment may contain at least one of Fe, Mn, Cr, and Mo in a total amount of 0.001% by mass or more and 0.05% by mass or less. When at least one of Fe, Mn, Cr, and Mo is added within this range of the total amount, crack development suppressing effect on the lead-free solder alloy is improved. However, it is not preferred that the total amount be more than 0.05% by mass, because it increases the melting temperature of the lead-free solder alloy, and readily develop voids in the solder joints.

The lead-free solder alloy of the present embodiment may be contained other components (elements) such as Cd, Tl, Se, Au, Ti, Si, Al, Mg, and Zn as long as its effect will not be inhibited. In addition, the lead-free solder alloy of the present embodiment naturally contains unavoidable impurities.

In the lead-free solder alloy of the present embodiment, the balance is preferably composed of Sn. The Sn content is preferably 79.8% by mass or more and less than 97.49% by mass.

The formation of the solder joints of the present embodiment may use any method as long as it forms solder joints, such as a flow method, implementation by solder balls, or a reflow method using a solder paste composition. Among them, the reflow method using a solder paste composition is particularly preferred.

(2) Solder Paste Composition

The solder paste composition of the present embodiment is prepared by, for example, kneading together the lead-free solder alloy in a powder form and a flux composition containing a base resin (A), an activator (B), a thixotropic agent (C), and a solvent (D), and making a paste.

(A) Base Resin

The base resin (A) is preferably, for example, a rosin resin (A-1) and/or a synthetic resin (A-2).

Examples of the rosin resin (A-1) include rosins such as tall oil rosin, gum rosin, and wood rosin; rosin derivatives prepared by polymerization, hydrogenation, disproportionation, acrylation, maleation, esterification, or phenol addition reaction of rosin; and modified rosin resins obtained by Diels-Alder reaction of the rosin or rosin derivative and an unsaturated carboxylic acid (for example, acrylic acid, methacrylic acid, maleic acid anhydride, and fumaric acid). Among them, modified rosin resins are preferred, and the hydrogenated acrylic acid-modified rosin resin prepared by hydrogenation of acrylic acid is particularly preferred. They may be used alone, or in combination of plural kinds of them.

The acid value of the rosin resin (A-1) is preferably from 140 mgKOH/g to 350 mgKOH/g, and the mass average molecular weight is preferably from 200 Mw to 1,000 Mw.

Examples of the synthetic resin (A-2) include acrylic resins, styrene-maleic acid resins, epoxy resins, urethane resins, polyester resins, phenoxy resins, terpene resins, polyalkylene carbonates, and derivative compounds prepared by dehydration condensation of a rosin resin having a carboxyl group and a dimer acid derivative flexible alcohol compound. They may be used alone, or in combination of plural kinds of them. Among them, acrylic resin is preferred.

The acrylic resin is obtained by, for example, homopolymerization of a (meth)acrylate having an alkyl group with 1 to 20 carbon atoms, or copolymerization of monomers composed mainly of the acrylate. Among these acrylic resins, preferred is the acrylic resin obtained by polymerization of a methacrylic acid and a monomer including the monomer having two saturated alkyl groups with a liner carbon chain having 2 to 20 carbon atoms. The acrylic resin may be used alone, or in combination of plural kinds of them.

Regarding the derivative compound prepared by dehydration condensation of a carboxylic rosin resin and a dimer acid-derivative flexible alcohol compound (hereinafter referred to as "rosin derivative compound"), examples of the carboxylic rosin resin include rosin such as tall oil rosin, gum rosin, and wood rosin; rosin derivatives such as hydrogenated rosin, polymer rosin, disproportionated rosin, acrylic acid-modified rosin, and maleic acid-modified rosin; and other rosin having a carboxyl group. They may be used alone, or in combination of plural kinds of them.

The dimer acid derivative flexible alcohol compound is, for example, a compound which is derived from a dimer acid such as dimer diol, polyester polyol, or polyester dimer diol, and has an alcohol group at the end, and examples include PRIPOL2033, PRIPLAS T3197, and PRIPLAST1838 (manufactured by Croda Japan KK).

The rosin derivative compound is obtained by dehydration condensation of the carboxylic rosin resin and the dimer acid derivative flexible alcohol compound. The method for dehydration condensation may be a commonly used one. The mass ratio between the carboxylic rosin resin and the dimer acid derivative flexible alcohol compound for dehydration condensation is preferably from 25:75 to 75:25.

The acid value of the synthetic resin (A-2) is preferably from 10 mgKOH/g to 150 mgKOH/g, and the mass average molecular weight is preferably from 1,000 Mw to 30,000 Mw.

The amount of the base resin (A) is preferably 10% by mass or more and 60% by mass or less, and more preferably 30% by mass or more and 55% by mass or less with reference to the total amount of the flux composition. The acid value of the base resin (A) is preferably 10 mgKOH/g or more and 250 mgKOH/g or less, and the mass average molecular weight is preferably from 300 Mw to 30,000 Mw.

When the rosin resin (A-1) is used alone, the amount is preferably 20% by mass or more and 60% by mass or less, and more preferably 30% by mass or more and 55% by mass or less with reference to the total amount of the flux composition. When the amount of the rosin resin (A-1) is within these ranges, good solderability will be achieved.

When the synthetic resin (A-2) is used alone, the amount is preferably 10% by mass or more and 60% by mass or less, more preferably 15% by mass or more and 50% by mass or less with reference to the total amount of the flux composition.

When the rosin resin (A-1) and the synthetic resin (A-2) are used in combination, the compounding ratio is preferably from 20:80 to 50:50, and more preferably from 25:75 to 40:60.

The base resin (A) is preferably the rosin resin (A-1) alone, and the rosin resin (A-1) and synthetic resin (A-2) are preferably combinations of the acrylic resins.

(B) Activator

Examples of the activator (B) include amine salts such as hydrogen halide salts of organic amines (inorganic acid salts and organic acid salts), organic acids, organic acid salts, and organic amine salts. Specific examples include diphenylguanidine hydrobromide, cyclohexyl amine hydrobromide, diethylamine salt, dimer acid, levulinic acid, lactic acid, acrylic acid, benzoic acid, salicylic acid, anisic acid, citric acid, 1,4-cyclohexane dicarboxylic acid, anthranilic acid, picolinic acid, and 3-hydroxy-2-naphthoic acid. The amount of the activator (B) is preferably 4.5% by mass or more and 35% by mass or less with reference to the total amount of the flux composition. The activator (B) may be composed of one or more kinds of activators including the following activators (B-1), (B-2), and (B-3).

In the solder paste composition of the present embodiment, the flux composition preferably contains, as the activator (B), a linear saturated dicarboxylic acid (B-1) having 3 to 4 carbon atoms in an amount of 0.5% by mass or more and 3% by mass or less with reference to the total amount of the flux composition, a dicarboxylic acid (B-2) having 5 to 13 carbon atoms in an amount of 2% by mass or more and 15% by mass or less with reference to the total amount of the flux composition, and a dicarboxylic acid (B-3) having 20 to 22 carbon atoms in an amount of 2% by mass or more and 15% by mass or less with reference to the total amount of the flux composition. The total amount of these activators (B-1), (B-2) and (B-3) is preferably 4.5% by mass or more and 35% by mass or less, and more preferably 4.5% by mass or more and 20% by mass or less.

The linear saturated dicarboxylic acid (B-1) having 3 to 4 carbon atoms is preferably malonic acid and/or succinic acid.

The amount of the linear saturated dicarboxylic acid (B-1) having 3 to 4 carbon atoms is more preferably from 0.5% mass to 2% by mass with reference to the total amount of the flux composition.

The carbon chain in the dicarboxylic acid (B-2) having 5 to 13 carbon atoms may be linear or branched, but is preferably at least one selected from glutaric acid, adipic acid, pimelic acid, suberic acid, azelaic acid, 2-methylazelaic acid, sebacic acid, undecanedioic acid, 2,4-dimethyl-4-methoxycarbonyl undecane diacid, dodecanedioic acid, tridecane diacid, and 2,4,6-trimethyl-4,6-dimethoxycarbonyl tridecane diacid. Among them, adipic acid, suberic acid, sebacic acid, and dodecanedioic acid are preferred.

The amount of the dicarboxylic acid (B-2) having 5 to 13 carbon atoms is more preferably from 3% by mass to 12% by mass with reference to the total amount of the flux composition.

The carbon chain in the dicarboxylic acid (B-3) having 20 to 22 carbon atoms may be linear or branched, but is preferably at least one selected from eicosane diacid, 8-ethyloctadecane dioic acid, 8,13-dimethyl-8,12-eicosadiene diacid, and 11-vinyl-8-octadecene diacid.

The dicarboxylic acid (B-3) having 20 to 22 carbon atoms is more preferably in a liquid or semi-solid state at normal temperature. In the present description, the term "normal temperature" means the temperature range from 5° C. to 35° C. In addition, the term "semi-solid" means the state between a liquid state and a solid state, the state partially having flowability, and the state having no flowability but deformable by external force. As the dicarboxylic acid (B-3) having 20 to 22 carbon atoms, 8-ethyloctadecane diacid is particularly preferred.

The amount of the dicarboxylic acid (B-3) having 20 to 22 carbon atoms is more preferably from 3% by mass to 12% by mass with reference to the total amount of the flux composition.

When the activator (B) contains dicarboxylic acids corresponding to the ranges of the carbon numbers of the activators (B-1), (B-2), and (B-3) in the above-described amounts, the oxide film is sufficiently removed even when an alloy powder composed of a lead-free solder alloy containing highly oxidative elements such as Bi, In, and Sb is used. Therefore, this solder paste composition enhances the cohesive force between the alloy powders, and reduces viscosity during solder melting, whereby solder balls occurring at the side of electronic components is reduced, and the voids occurring in the solder joint are further reduced.

More specifically, when the flux composition and the alloy powder are kneaded together, a portion of the linear saturated dicarboxylic acid (B-1) having 3 to 4 carbon atoms coats the surface of the alloy powder to suppress surface oxidation. In addition, the dicarboxylic acid (B-3) having 20 to 22 carbon atoms has low reactivity, and thus is stable in the printing process of the solder paste composition on a substrate over a long time. In addition, since the compound is resistant to volatilization during reflow heating, it coats the surface of the molten alloy powder, and suppresses oxidation by reducing action.

However, the dicarboxylic acid (B-3) having 20 to 22 carbon atoms have low activity, and thus the combination with the linear saturated dicarboxylic acid (B-1) having 3 to 4 carbon atoms may not sufficiently remove the oxide film from the alloy powder surface. Therefore, in particular, when an alloy powder composed of the lead-free solder alloy containing much amounts of Bi, In, and Sb, the oxidative effect on the alloy powder tends to be insufficient, and the suppressing effect on the solder balls and voids may not be thoroughly exerted. However, the flux composition contains the dicarboxylic acid (B-2) having 5 to 13 carbon atoms, which exerts strong activity from the preheating process, in an amount within the above-described range, and thus can sufficiently remove the oxide film while ensuring reliability of the flux residue, even when such alloy powder is used.

Therefore, the solder paste composition of the present embodiment improves the flocculation force between alloy powders, and reduces the viscosity during solder melting, thereby suppressing the occurrence of solder balls beside the electronic components, and further reduces voids occurring in the solder joints. The flux composition composed of these activators exerts good printability.

As described above, since the lead-free solder alloy of the present embodiment have the above-described composition and balanced contents, it suppresses crack development and void occurrence in the solder joints. Furthermore, when the flux composition contains the activators (B-1), (B-2), and (B-3), which are dicarboxylic acids corresponding to specific carbon number ranges, in predetermined amounts, it exerts good oxidation-reduction action on the solder alloy. Therefore, in this case, in the lead-free solder alloy of the present embodiment containing highly oxidative elements such as Bi, In, and Sb, the surface oxide film of the alloy powder is more thoroughly removed. As a result of this, residual voids in the solder joints can be more reduced, and crack development in the solder joints is further suppressed. In addition, this solder paste composition suppresses the occurrence of solder balls caused by difficulty in flocculation and coalescence between alloy powders, and achieves good printability.

(C) Thixotropic Agent

Examples of the thixotropic agent (C) include hydrogenation castor oil, fatty acid amides, saturated fatty acid bisamides, oxy fatty acids, and dibenzylidene sorbitols. They may be used alone, or in combination of plural kinds of them.

The amount of the thixotropic agent (C) is preferably 2% by mass or more and 15% by mass or less, and more preferably 2% by mass or more and 10% by mass or less with reference to the total amount of the flux composition.

(D) Solvent

Examples of the solvent (D) include isopropyl alcohol, ethanol, acetone, toluene, xylene, ethyl acetate, ethyl cellosolve, butyl cellosolve, hexyl diglycol, (2-ethylhexyl)diglycol, phenyl glycol, butyl carbitol, octanediol, α-terpineol, β-terpineol, tetraethylene glycol dimethyl ether, tris(2-ethylhexyl) trimellitate, and bisisopropyl sebacate. They may be used alone, or in combination of plural kinds of them.

The amount of the solvent (D) is preferably 20% by mass or more and 50% by mass or less, more preferably 25% by mass or more and 40% by mass or less with reference to the total amount of the flux composition.

The flux composition may contain an antioxidant for the purpose of inhibiting oxidation of the alloy powder. Examples of the antioxidant include hindered phenol antioxidants, phenol antioxidants, bisphenol antioxidants, and polymer antioxidants. Among them, hindered phenol oxidants are particularly preferred. They may be used alone, or in combination of plural kinds of them.

The amount of the antioxidant is not particularly limited, and generally preferably about 0.5% by mass or more and 5% by mass or less with reference to the total amount of the flux composition.

The flux composition may contain additives as necessary. Examples of the additive include anti-foaming agents, surfactants, delustering agents, and inorganic fillers. They may be used alone, or in combination of plural kinds of them. The amount of the additive is preferably 0.5% by mass or more and 20% by mass or less, and more preferably 1% by mass or more and 15% by mass or less with reference to the total amount of the flux composition.

In the solder paste composition of the present embodiment, the compounding ratio between the lead-free solder alloy powder and the flux composition is preferably from 65:35 to 95:5 in terms of the ratio of solder alloy powder: flux. The compounding ratio is more preferably from 85:15 to 93:7, and particularly preferably from 87:13 to 92:8.

The average particle size of the alloy powder is preferably 1 µm or more and 40 µm or less, more preferably 5 µm or more and 35 µm or less, and particularly preferably 10 µm or more and 30 µm or less.

(3) Electronic Circuit Board

The structure of the electronic circuit board of the present embodiment is described using FIG. 1. The electronic circuit board 100 of the present embodiment includes a substrate 1, an insulating layer 2, electrode parts (first electrodes) 3, an electronic component 4, and a soldered body 10. The soldered body 10 includes solder joints 6 and flux residues 7, and the electronic component 4 includes external electrodes (second electrodes) 5 and end parts 8.

The substrate 1 may be, for example, a printed circuit board, a silicon wafer, a ceramic package substrate, or any one used for mounting and packaging of electronic components.

The electrode parts 3 are electrically connected to the external electrodes 5 of the electronic component 4 through the solder joints 6.

The solder joints 6 are formed using the lead-free solder alloy of the present embodiment.

The electronic circuit board 100 having the above-described structure is an alloy composition which allows the solder joints 6 to exert crack development suppressing effect, so that it suppresses the development of cracks occurring in the solder joints 6. In particular, it exerts crack development suppressing effect in the vicinity of interfaces between the solder joints 6 and the electronic component 4, even when the electronic component 4 has no Ni/Pd/Au plating or Ni/Au plating. This suppresses the electrode peeling phenomenon of the electronic component 4. In addition, since the solder joints 6 is composed of the lead-free solder alloy of the present embodiment, it suppresses the occurrence of voids.

The electronic circuit board 100 is made by, for example, as follows. Firstly, the solder paste composition is printed according to the above-described pattern on the substrate 1 which includes the insulating layer 2 and the electrode parts 3 formed to have predetermined patterns.

Subsequently, the electronic component 4 is mounted on the substrate 1 after printing, and reflowed in the temperature range from 230° C. to 260° C. As a result of this reflowing, the soldered bodies 10 having the solder joints 6 and the flux residues 7 on the substrate 1 is formed, and the electronic circuit board 100 electrically connecting the substrate 1 and the electronic component 4 is made.

When the soldered body 10 is made using the solder paste composition composed of a flux composition and the activators (B-1), (B-2), and (B-3), which are dicarboxylic acids corresponding to specific carbon number ranges, in predetermined amounts, the surface oxide film of the lead-free solder alloy powder of the present embodiment is more thoroughly removed. Therefore, void residues in the solder joints can be more suppressed, and crack development in the solder joints is further suppressed. This solder paste composition hinders flocculation and coalescence between the alloy powders, and thus suppresses the occurrence of solder balls on the substrate 1, and provides the electronic circuit board 100 having higher reliability.

In addition, the electronic controller (the electronic device) of the present embodiment is made by incorporating the electronic circuit board 100.

EXAMPLES

The present embodiment will be described in detail below with reference to Examples and Comparative Examples. The present invention will not be limited to these Examples.

Examples 1 to 33 and Comparative Examples 1 to 20

Preparation of Flux Composition

The following components were kneaded together, whereby the flux compositions according to Examples 1 to 33, and Comparative Examples 1 to 20 were obtained.

Base Resin (A)
Hydrogenated acid modified rosin (product name: KE-604, Arakawa Chemical Industries, Ltd.) 51% by mass
Activator (B)
Dodecanedioic acid 10% by mass (product name: SL-12, Okamura Oil Mill Co., Ltd.)
Malonic acid 1% by mass
Diphenylguanidine hydrobromide 2% by mass
Thixotropic agent (C)
Cured castor oil 6% by mass
Solvent (D)
Diethylene glycol monohexyl ether 29% by mass
Antioxidant
Hindered phenol antioxidant (product name: IRGANOX 245, BASF Japan) 1% by mass
Preparation of Solder Paste Composition 11.0% by mass of the flux composition and 89.0% by mass of the powder of the lead-free solder alloys (powder particle size: from 20 µm to 38 µm) listed in Tables 1 and 2 were mixed, thus making the solder paste compositions of Examples 1 to 33 and Comparative Examples 1 to 20.

TABLE 1

|  | Sn | Ag | Cu | Bi | In | Sb | Ni | Co | Others |
|---|---|---|---|---|---|---|---|---|---|
| Example1 | Balance | 3.0 | 0.5 | 3.0 | — | 1.0 | 0.03 | — | — |
| Example2 | Balance | 3.0 | 0.5 | 3.0 | — | 2.0 | 0.03 | — | — |
| Example3 | Balance | 3.0 | 0.5 | 3.0 | — | 5.0 | 0.03 | — | — |
| Example4 | Balance | 1.0 | 0.5 | 3.0 | — | 3.0 | 0.03 | — | — |
| Example5 | Balance | 1.0 | 0.5 | 3.0 | — | 5.0 | 0.03 | — | — |
| Example6 | Balance | 3.1 | 0.5 | 3.0 | — | 3.0 | 0.03 | — | — |
| Example7 | Balance | 3.1 | 0.5 | 3.0 | — | 5.0 | 0.03 | — | — |
| Example8 | Balance | 3.0 | 0.7 | 3.0 | — | 3.0 | 0.03 | — | — |
| Example9 | Balance | 3.0 | 0.7 | 3.0 | — | 5.0 | 0.03 | — | — |
| Example10 | Balance | 3.0 | 1.0 | 3.0 | — | 3.0 | 0.03 | — | — |
| Example11 | Balance | 3.0 | 1.0 | 3.0 | — | 5.0 | 0.03 | — | — |

TABLE 1-continued

|  | Sn | Ag | Cu | Bi | In | Sb | Ni | Co | Others |
|---|---|---|---|---|---|---|---|---|---|
| Example12 | Balance | 3.0 | 0.5 | 0.5 | — | 3.0 | 0.03 | — | — |
| Example13 | Balance | 3.0 | 0.5 | 0.5 | — | 5.0 | 0.03 | — | — |
| Example14 | Balance | 3.0 | 0.5 | 4.5 | — | 3.0 | 0.03 | — | — |
| Example15 | Balance | 3.0 | 0.5 | 4.5 | — | 5.0 | 0.03 | — | — |
| Example16 | Balance | 3.0 | 0.5 | 3.0 | — | 3.0 | 0.01 | — | — |
| Example17 | Balance | 3.0 | 0.5 | 3.0 | — | 3.0 | 0.25 | — | — |
| Example18 | Balance | 3.0 | 0.7 | 3.5 | — | 1.5 | 0.03 | 0.001 | — |
| Example19 | Balance | 3.0 | 0.7 | 3.5 | — | 2.0 | 0.03 | 0.001 | — |
| Example20 | Balance | 3.0 | 0.7 | 3.5 | — | 3.0 | 0.03 | 0.001 | — |
| Example21 | Balance | 3.0 | 0.7 | 3.0 | — | 3.0 | 0.03 | 0.01 | — |
| Example22 | Balance | 3.0 | 0.7 | 3.0 | — | 3.0 | 0.03 | 0.25 | — |
| Example23 | Balance | 3.0 | 0.7 | 3.1 | — | 3.0 | 0.03 | 0.008 | — |
| Example24 | Balance | 3.0 | 0.7 | 3.2 | — | 3.0 | 0.03 | 0.008 | — |
| Example25 | Balance | 3.0 | 0.7 | 3.2 | 3.0 | 3.0 | 0.03 | 0.008 | — |
| Example26 | Balance | 3.0 | 0.7 | 3.2 | 6.0 | 3.0 | 0.03 | 0.008 | — |
| Example27 | Balance | 3.0 | 0.7 | 3.2 | — | 3.0 | 0.03 | 0.008 | 0.05P |
| Example28 | Balance | 3.0 | 0.7 | 3.2 | — | 3.0 | 0.03 | 0.008 | 0.05Ge |
| Example29 | Balance | 3.0 | 0.7 | 3.2 | — | 3.0 | 0.03 | 0.008 | 0.05Ga |
| Example30 | Balance | 3.0 | 0.7 | 3.2 | — | 3.0 | 0.03 | 0.008 | 0.05Fe |
| Example31 | Balance | 3.0 | 0.7 | 3.2 | — | 3.0 | 0.03 | 0.008 | 0.05Mn |
| Example32 | Balance | 3.0 | 0.7 | 3.2 | — | 3.0 | 0.03 | 0.008 | 0.05Cr |
| Example33 | Balance | 3.0 | 0.7 | 3.2 | — | 3.0 | 0.03 | 0.008 | 0.05Mo |

TABLE 2

|  | Sn | Ag | Cu | Bi | In | Sb | Ni | Co | Others |
|---|---|---|---|---|---|---|---|---|---|
| Comparative Example1 | Balance | 3.0 | 0.5 | 3.0 | — | 0.5 | 0.03 | — | — |
| Comparative Example2 | Balance | 3.0 | 0.5 | 3.0 | — | 6.0 | 0.03 | — | — |
| Comparative Example3 | Balance | 0.5 | 0.5 | 3.0 | — | 2.0 | 0.03 | — | — |
| Comparative Example4 | Balance | 0.5 | 0.5 | 3.0 | — | 5.0 | 0.03 | — | — |
| Comparative Example5 | Balance | 3.0 | 1.5 | 3.0 | — | 2.0 | 0.03 | — | — |
| Comparative Example6 | Balance | 3.0 | 1.5 | 3.0 | — | 5.0 | 0.03 | — | — |
| Comparative Example7 | Balance | 3.0 | 0.5 | 5.0 | — | 2.0 | 0.03 | — | — |
| Comparative Example8 | Balance | 3.0 | 0.5 | 5.0 | — | 5.0 | 0.03 | — | — |
| Comparative Example9 | Balance | 3.0 | 0.5 | 3.0 | — | 3.0 | — | — | — |
| Comparative Example10 | Balance | 3.0 | 0.5 | 3.0 | — | 3.0 | 0.3 | — | — |
| Comparative Example11 | Balance | 4.0 | 0.5 | 4.5 | — | 5.0 | 0.03 | — | — |
| Comparative Example12 | Balance | 3.0 | 0.7 | 3.2 | — | 3.0 | 0.03 | 0.3 | — |
| Comparative Example13 | Balance | 3.0 | 0.7 | 3.2 | 6.5 | 3.0 | 0.03 | 0.008 | — |
| Comparative Example14 | Balance | 3.0 | 0.7 | 3.2 | — | 3.0 | 0.03 | 0.008 | 0.1P |
| Comparative Example15 | Balance | 3.0 | 0.7 | 3.2 | — | 3.0 | 0.03 | 0.008 | 0.1Ge |
| Comparative Example16 | Balance | 3.0 | 0.7 | 3.2 | — | 3.0 | 0.03 | 0.008 | 0.1Ga |
| Comparative Example17 | Balance | 3.0 | 0.7 | 3.2 | — | 3.0 | 0.03 | 0.008 | 0.1Fe |
| Comparative Example18 | Balance | 3.0 | 0.7 | 3.2 | — | 3.0 | 0.03 | 0.008 | 0.1Mn |
| Comparative Example19 | Balance | 3.0 | 0.7 | 3.2 | — | 3.0 | 0.03 | 0.008 | 0.1Cr |
| Comparative Example20 | Balance | 3.0 | 0.7 | 3.2 | — | 3.0 | 0.03 | 0.008 | 0.1Mo |

(1) Solder Crack Test (from −40° C. to 125° C.)

−3.2 mm×1.6 mm Chip Component (Chip A)

A chip component of 3.2 mm×1.6 mm (Ni/Sn-plated), a glass epoxy substrate having a solder resist with a pattern on which a chip component of the size is mountable and an electrode (1.6 mm×1.2 mm) for connecting the chip component, and a metal mask having thickness 150 μm with the same pattern were provided.

The solder paste compositions were printed on the glass epoxy substrates using the metal mask, and the chip component was mounted on each of them.

Thereafter, each glass epoxy substrate was heated using a reflow furnace (product name: TNP-538EM, TAMURA Corporation), and solder joints which electrically bonding the glass epoxy substrate and the chip component were formed on each of them, whereby the chip component was mounted. The reflow conditions were as follows: preheating was carried out for 110 seconds in the temperature range from 170° C. to 190° C.; the peak temperature was 245° C.; the preheating time was 65 seconds at 200° C. or higher, and 45 seconds at 220° C. or higher; the cooling rate from the peak temperature to 200° C. was from 3° C. to 8° C./second; and the oxygen concentration was set at 1500±500 ppm.

Thereafter, the glass epoxy substrates were exposed to the environment repeating 1,000, 1,500, 2,000, 2,500, and 3,000 cycles of thermal shock cycles using a thermal shock tester (product name: ES-76LMS, Hitachi Appliances, Inc.) set at −40° C. (30 minutes) to 125° C. (30 minutes), then taken out, whereby test substrates were made.

Subsequently, the object portion of the test substrates were cut out, and sealed using an epoxy resin (product name: EPOMOUNT (main agent and curing agent), Refine Tec Ltd.). Furthermore, the center cross sections of the chip components of the test substrates were made visible using a wet polisher (product name: TegraPol-25, Marumoto Struers K.K.), whether the crack appearing at the solder joint completely crossed the solder joint to cause rupture was observed using a scanning electron microscope (product name: TM-1000, Hitachi High-Technologies Corporation), and evaluated based on the following criteria. The results are shown in Tables 3 and 4. The number of evaluated chips in each thermal shock cycle was 10.

⊙: Up to 3,000 cycles, there was no crack completely crossing the solder joints.

○: A crack completely crossing the solder joints appeared between 2,501 and 3,000 cycles.

Δ: A crack completely crossing the solder joints appeared between 2,001 and 2,500 cycles.

x: A crack completely crossing the solder joints appeared at 2,000 cycles or less.

2.0×1.2 mm Chip Component (Chip B)

Test substrates were made under the same conditions as those for the 3.2 mm×1.6 mm chip component, except that a glass epoxy substrate equipped with a 2.0 mm×1.2 mm chip component (Ni/Sn-plated), a solder resist having a pattern on which a chip having the above-described size is mountable, and an electrode (1.25 mm×1.0 mm) for connecting the chip component was used, and evaluated by the same method. The results are shown in Tables 3 and 4.

(2) Solder Cracking Test on Sn-Plated SON

A glass epoxy substrate including a 1.3-mm pitch SON (Small Outline Non-leaded package) component (number of terminal: 8 pins, product name: STL60N3LLH5, STMicroelectronics) having size of 6 mm×5 mm×0.8 t mm, a solder resist having a pattern on which the SON component is mountable, and an electrode for connecting the SON component (in conformity with the design recommended by the manufacturer), and a metal mask having the same pattern and a thickness of 150 μm were provided.

The solder paste compositions were individually printed on the glass epoxy substrate using the metal mask, and the SON component was mounted on each of them. Thereafter, test substrates were made in same conditions as those in the solder cracking test (1), except that the glass epoxy substrates were repeatedly subjected to 1,000, 2,000, and 3,000 thermal shock cycles.

Subsequently, the object portion of the test substrates were cut out, and sealed using an epoxy resin (product name: EPOMOUNT (main agent and curing agent), Refine Tec Ltd.). Furthermore, the center cross sections of the SON component mounted on the test substrates were made visible using a wet polisher (product name: TegraPol-25, Marumoto Struers K.K.), and whether the crack appearing at the solder joint completely crossed the solder joint to cause rupture was observed using a scanning electron microscope (product name: TM-1000, Hitachi High-Technologies Corporation). Based on the observation, for the solder joints, the cracks occurred in the solder base material (in the present description, the solder base material means, in the solder joints, the interface of the electrode of the SON component and other portions except for the interface. Hereinafter the same shall apply. In Tables 3 and 4, these portions are referred merely as "base material".), and the cracks occurred in the interface between the solder joints and the electrode of the SON component (the intermetallic compound at the interface) were evaluated as follows. The results are shown in Tables 3 and 4. The number of the evaluated SONs in each thermal shock cycle was 20, and one terminal of the gate electrode for one SON was observed, and the cross sections of 20 terminals in total were examined.

Cracks Appeared in Solder Base Material

⊙: Up to 3,000 cycles, there was no crack completely crossing the solder base material.

○: A crack completely crossing the solder base material appeared between 2,001 and 3,000 cycles.

Δ: A crack completely crossing the solder base material appeared between 1,001 and 2,000 cycles.

x: A crack completely crossing the solder base material appeared at 1,000 cycles or less.

Cracks Appeared in the Interface Between Solder Joint and Electrode of SON Component ⊙: Up to 3,000 cycles, there was no crack completely crossing the interface.

○: A crack completely crossing the interface appeared between 2,001 and 3,000 cycles.

Δ: A crack completely crossing the interface appeared between 1,001 and 2,000 cycles.

x: A crack completely crossing the interface appeared at 1,000 cycles or less.

(3) Solder Cracking Test (from −40° C. to 150° C.)

In-car substrates are placed in severe environments with extreme temperature variations, so that the alloys used in them are required to effectively prevent crack development. Therefore, in order to examine whether the solder alloy according to the present example could exert that effect under more harsh conditions, a solder cracking test was carried out using a liquid tank type heat shock tester with a temperature difference from −40° C. to 150° C. The conditions are as follows.

Test substrates each equipped with a 3.2 mm×1.6 mm chip component (chip A) and a 2.0 mm×1.2 mm chip component (chip B) were made under the same conditions as those in the solder cracking test (1), except that the glass epoxy substrates after solder joint formation were repeatedly subjected to 1,000, 2,000, and 3,000 thermal shock cycles using a liquid tank type heat shock tester (product name: ETAC WINTECH LT80, Kusumoto Chemicals, Ltd.) set at −40° C. (5 minutes) to 150° C. (5 minutes).

Subsequently, the object portion of the test substrates were cut out, and sealed using an epoxy resin (product name: EPOMOUNT (main agent and curing agent), Refine Tec Ltd.). Furthermore, the center cross sections of the chip components of the test substrates were made visible using a wet polisher (product name: TegraPol-25, Marumoto Struers K.K.), whether the crack appearing at the solder joint completely crossed the solder joint to cause rupture was observed using a scanning electron microscope (product name: TM-1000, Hitachi High-Technologies Corporation), and evaluated based on the following criteria. The results are shown in Tables 3 and 4. The number of evaluated chips in each thermal shock cycle was 10.

⊙: Up to 3,000 cycles, there was no crack completely crossing the solder joints.

⊖: A crack completely crossing the solder joints appeared between 2,001 and 3,000 cycles.

Δ: A crack completely crossing the solder joints appeared between 1,001 and 2,000 cycles.

x: A crack completely crossing the solder joints appeared at 1,000 cycles or less.

(4) Void Test

A glass epoxy substrate including a chip component of 2.0 mm×1.2 mm (chip B: Ni/Sn-plated), a solder resist with a pattern on which a chip component of the above-described size is mountable, and an electrode (1.25 mm×1.0 mm) for connecting the chip component, and a metal mask having the same pattern and a thickness of 150 μm were provided.

The solder paste compositions were printed on the glass epoxy substrates using the metal mask, the chip component was mounted on each of them, the glass epoxy substrates were heated using a reflow furnace (product name: TNP-538EM, TAMURA Corporation) to form solder joints which electrically join the glass epoxy substrates and the chip components, thus the test substrates equipped with the chip components were formed. The reflow conditions were the same as those in the solder cracking test (1).

Figure 3:
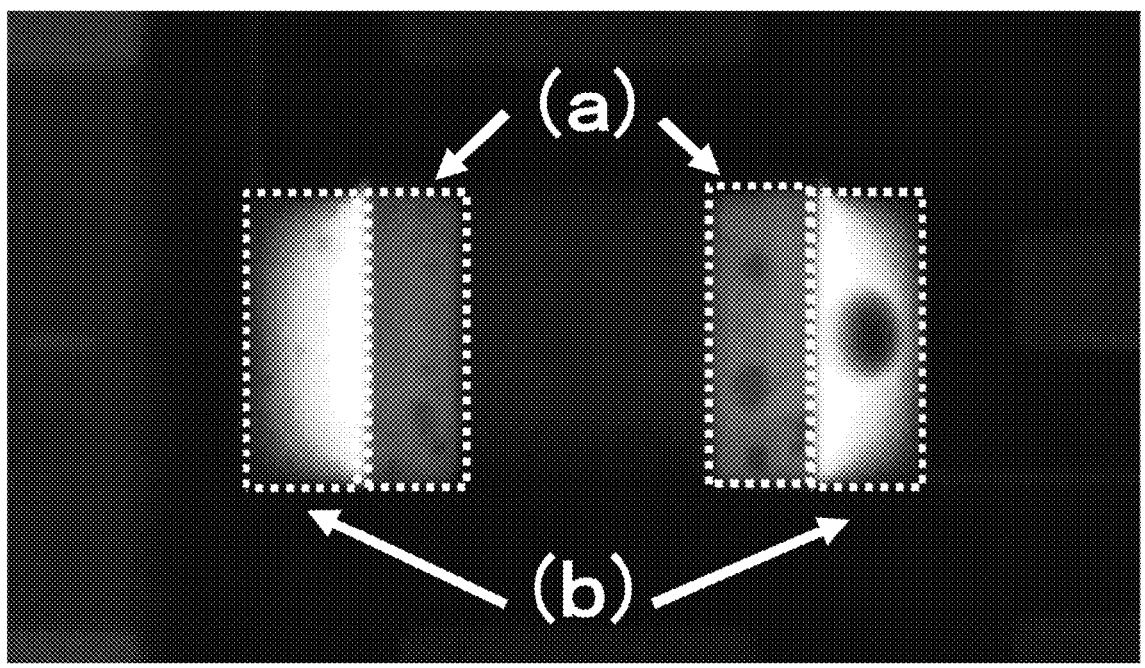
FIG. 3 is a photograph of a substrate equipped with common chip components, which was taken from the chip component side using an X ray equipment, for showing the "region under the electrode of the chip components" and "the region having a fillet" for observing the presence or absence of void occurrence in Examples and Comparative Examples of the present invention.
Figure 4:
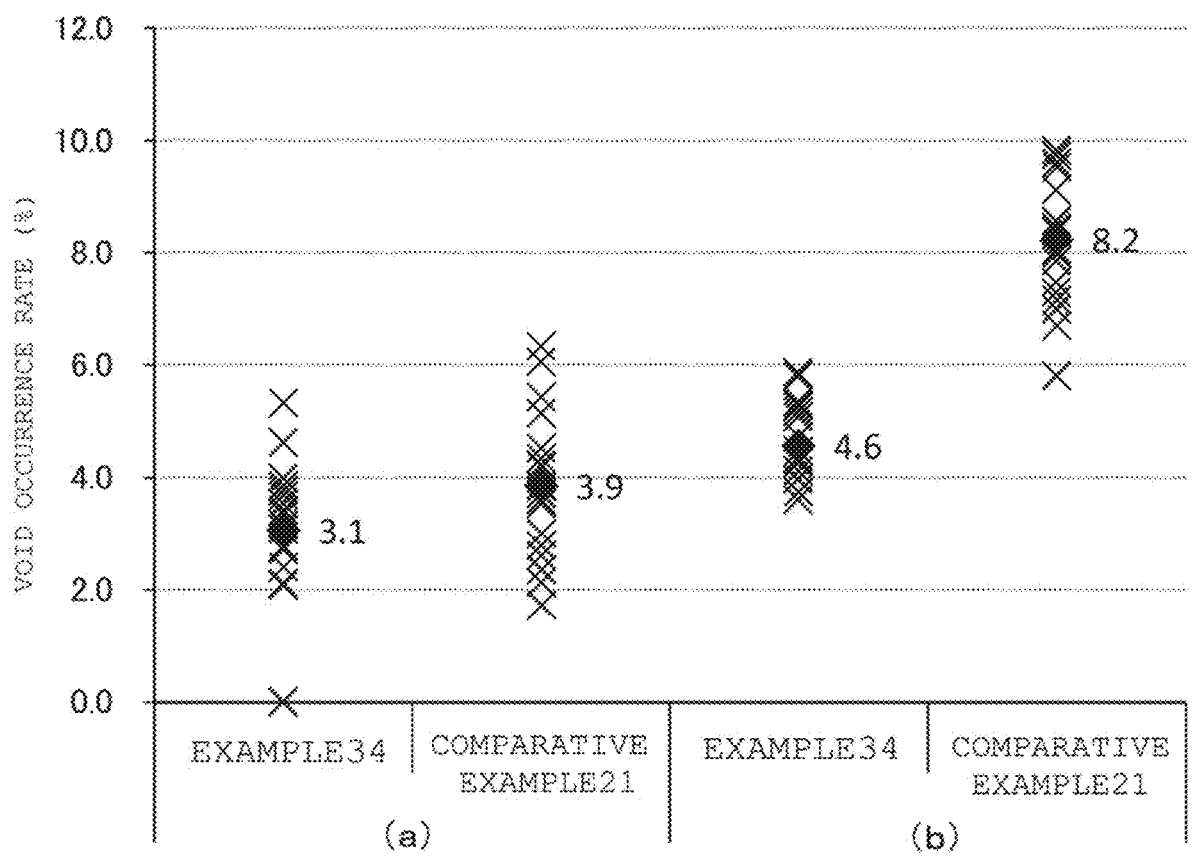
FIG. 4 is a graph showing the area ratio of voids measured in Examples and Comparative Examples of the present invention.

Subsequently, the surface condition of these test substrates was observed using an X-ray inspection apparatus (product name: SMX-160E, Shimadzu Co., Ltd.), the average area ratio of voids occupying in the regions under the electrodes of the chip components (the region (a) encircled by broken line in FIG. 3) (the ratio of total void area. Hereinafter the same applies) and the average area ratio of voids occupying in the fillet region (the region (b) encircled by broken line in FIG. 3) in the 40 lands on the test substrates were determined, and evaluated as follows. The results are shown in Tables 3 and 4.

⊙: The average area ratio of voids is 3% or less, and the suppressing effect on the occurrence of voids is very good.

○: The average area ratio of voids is more than 3% and 5% or less, and the suppressing effect on the occurrence of voids is good.

Δ: The average area ratio of voids is more than 5% and 8% or less, and the suppressing effect on the occurrence of voids is sufficient.

x: The average area ratio of voids is more than 8%, and the suppressing effect on the occurrence of voids is insufficient.

TABLE 3

| | Solder cracking (−40° C. to 125° C.) | | Sn-plated SON cracking | | Solder cracking (−40° C. to 150° C.) | | Void | |
|---|---|---|---|---|---|---|---|---|
| | Chip A | Chip B | Base material | Interface | Chip A | Chip B | Under electrode | Fillet |
| Example1 | ○ | ⊙ | ○ | ○ | Δ | Δ | ○ | ○ |
| Example2 | ○ | ⊙ | ○ | ○ | Δ | Δ | ○ | Δ |
| Example3 | ⊙ | ⊙ | ⊙ | ○ | ○ | ○ | ○ | Δ |
| Example4 | ○ | ○ | ○ | ○ | Δ | Δ | Δ | Δ |
| Example5 | ○ | ⊙ | ○ | ○ | Δ | Δ | Δ | Δ |
| Example6 | ⊙ | ⊙ | ⊙ | ○ | Δ | Δ | ○ | Δ |
| Example7 | ⊙ | ⊙ | ⊙ | ○ | ○ | ○ | ○ | Δ |
| Example8 | ⊙ | ⊙ | ⊙ | ○ | Δ | Δ | ○ | Δ |
| Example9 | ⊙ | ⊙ | ⊙ | ○ | ○ | ○ | ○ | Δ |
| Example10 | ⊙ | ⊙ | ⊙ | ○ | Δ | ○ | Δ | Δ |
| Example11 | ⊙ | ⊙ | ⊙ | ○ | ○ | ○ | Δ | Δ |
| Example12 | ○ | ○ | ○ | ○ | Δ | Δ | ○ | Δ |
| Example13 | ⊙ | ⊙ | ⊙ | ○ | Δ | Δ | Δ | Δ |
| Example14 | ⊙ | ⊙ | ⊙ | ○ | ○ | ○ | ○ | ○ |
| Example15 | ⊙ | ⊙ | ⊙ | ○ | ○ | ⊙ | ○ | ○ |
| Example16 | ⊙ | ⊙ | ⊙ | Δ | Δ | Δ | ○ | Δ |
| Example17 | ⊙ | ⊙ | ⊙ | ⊙ | Δ | Δ | Δ | Δ |
| Example18 | ⊙ | ⊙ | ○ | ○ | Δ | Δ | ○ | ○ |
| Example19 | ⊙ | ⊙ | ⊙ | ○ | ○ | ○ | ○ | ○ |
| Example20 | ⊙ | ⊙ | ⊙ | ○ | Δ | ○ | ○ | ○ |
| Example21 | ⊙ | ⊙ | ⊙ | ○ | Δ | ○ | ○ | Δ |
| Example22 | ⊙ | ⊙ | ⊙ | ⊙ | Δ | ○ | Δ | Δ |
| Example23 | ⊙ | ⊙ | ⊙ | ○ | Δ | ○ | ○ | ○ |
| Example24 | ⊙ | ⊙ | ⊙ | ○ | ○ | ○ | ○ | ○ |
| Example25 | ⊙ | ⊙ | ⊙ | ⊙ | ○ | ⊙ | Δ | ○ |
| Example26 | ⊙ | ⊙ | ⊙ | ○ | ⊙ | ⊙ | Δ | ○ |
| Example27 | ⊙ | ⊙ | ⊙ | ○ | ○ | ○ | ○ | ○ |
| Example28 | ⊙ | ⊙ | ⊙ | ○ | ○ | ○ | ○ | ○ |
| Example29 | ⊙ | ⊙ | ⊙ | ○ | ○ | ○ | ○ | ○ |
| Example30 | ⊙ | ⊙ | ⊙ | ○ | ○ | ○ | Δ | ○ |
| Example31 | ⊙ | ⊙ | ⊙ | ○ | ○ | ○ | ○ | ○ |
| Example32 | ⊙ | ⊙ | ⊙ | ○ | ○ | ○ | Δ | ○ |
| Example33 | ⊙ | ⊙ | ⊙ | ○ | ○ | ○ | Δ | ○ |

TABLE 4

| | Solder cracking (−40° C. to 125° C.) | | Sn-plated SON cracking | | Solder cracking (−40° C. to 150° C.) | | Void | |
|---|---|---|---|---|---|---|---|---|
| | Chip A | Chip B | Base material | Interface | Chip A | Chip B | Under electrode | Fillet |
| Comparative Example1 | Δ | Δ | ○ | ○ | X | Δ | ○ | ○ |
| Comparative Example2 | ○ | Δ | ○ | ○ | X | X | X | X |
| Comparative Example3 | Δ | Δ | ○ | ○ | X | X | Δ | Δ |
| Comparative Example4 | Δ | Δ | ○ | ○ | X | X | X | X |
| Comparative Example5 | Δ | Δ | ○ | ○ | X | X | Δ | X |
| Comparative Example6 | ○ | ○ | ○ | ○ | X | X | X | X |
| Comparative Example7 | ⊙ | ⊙ | ⊙ | ○ | X | X | ○ | ○ |
| Comparative Example8 | ⊙ | ⊙ | ⊙ | ○ | X | X | ○ | ○ |
| Comparative Example9 | ⊙ | ⊙ | ⊙ | X | Δ | Δ | ○ | ○ |
| Comparative Example10 | Δ | ○ | ○ | ⊙ | X | Δ | Δ | X |
| Comparative Example11 | ○ | ○ | ○ | ○ | Δ | Δ | Δ | X |
| Comparative Example12 | Δ | ○ | ○ | ⊙ | X | Δ | Δ | X |
| Comparative Example13 | Δ | ○ | ○ | ○ | Δ | ○ | X | Δ |

TABLE 4-continued

|  | Solder cracking (−40° C. to 125° C.) | | Sn-plated SON cracking | | Solder cracking (−40° C. to 150° C.) | | Void | |
|---|---|---|---|---|---|---|---|---|
|  | Chip A | Chip B | Base material | Interface | Chip A | Chip B | Under electrode | Fillet |
| Comparative Example14 | Δ | Δ | ○ | ○ | X | X | X | X |
| Comparative Example15 | Δ | Δ | ○ | ○ | X | X | X | X |
| Comparative Example16 | Δ | Δ | ○ | ○ | X | X | X | X |
| Comparative Example17 | Δ | Δ | ○ | ○ | X | X | X | X |
| Comparative Example18 | Δ | Δ | ○ | ○ | X | X | X | X |
| Comparative Example19 | Δ | Δ | ○ | ○ | X | X | X | X |
| Comparative Example20 | Δ | Δ | ○ | ○ | X | X | X | X |

As described above, the solder joint formed using the lead-free solder alloys according to Examples 1 to 33 achieved crack development suppressing effect in the solder joints and in the vicinity of interfaces, even in a severe environment with extreme temperature variations and vibration loads, and irrespective of the chip size and the presence or absence of Ni/Pd/Au plating or Ni/Au plating on the electrodes. In particular, the solder joints of Examples showed good crack suppressing effect even in a very severe environment with temperature variations from −40° C. to 150° C. made using a liquid tank type heat shock tester.

Particularly in Examples 16 to 33 using Ni and Co, good crack development suppressing effect was achieved in solder joints and in the vicinity of interfaces under any conditions.

In addition, in the present examples, crack development suppressing effect was improved while good void suppressing effect was achieved, even when highly oxidative Bi, Sb, Ni, Co, and others were contained above certain amounts. In addition, the occurrence of voids in fillets was suppressed even when Ni and Co were contained in amounts of 0.25% by mass as in, for example, Examples 17 and 22.

Furthermore, the lead-free solder alloy according to Example 15 achieved crack development suppressing effect and good void suppressing effect even when highly oxidative Bi and Sb were contained in amounts of 4.5% by mass and 5% by mass, respectively, owing to the combination with other alloy elements and the content balance. On the other hand, regarding the Blead-free solder alloy according to Comparative Example 11 wherein the Bi and Sb contents were 4.5% by mass, 5% by mass, and the Ag content was 4% by mass, the rating of voids in the fillet was x in the result of the void test (4).

Accordingly, the electronic circuit boards having such solder joints are suitable to in-car electronic circuit substrates and other electronic circuit boards exposed to extreme temperature variations and required to have high reliability.

Furthermore, these electronic circuit boards are suitable to electronic controllers required to have further higher reliability.

In addition, the above-described flux composition was mixed with 89% by weight of the following two solder alloy powders (powder particle size: from 20 μm to 38 μm), thus making solder paste compositions (Example 34 and Comparative Example 21).

Solder Alloy Powders

Example 34: Sn-3.1Ag-0.7Cu-3.2Bi-3Sb-0.03Ni

Comparative Example 21: Sn-3.4Ag-0.7Cu-3.2Bi-3Sb-0.03Ni

Test substrates were made under the same conditions as those in the void test (4), and the area ratio of voids were measured. The results are shown in Table 5. The voids were numbered n1, n2, . . . , and the area ratios of voids in each are shown. The unit of the values is %. The following results are graphed and shown in Table 4.

TABLE 5

|  |  | (a) | | (b) | |
|---|---|---|---|---|---|
|  |  | Example 34 | Comparative Example 21 | Example 34 | Comparative Example 21 |
| Land No. | n1 | 2.8 | 4.5 | 5.8 | 8.6 |
|  | n2 | 3.5 | 6.1 | 5.3 | 8.0 |
|  | n3 | 0.0 | 2.1 | 4.0 | 9.7 |
|  | n4 | 3.1 | 3.5 | 5.3 | 8.5 |
|  | n5 | 4.0 | 3.9 | 4.3 | 9.6 |
|  | n6 | 3.8 | 4.2 | 4.4 | 5.8 |
|  | n7 | 3.2 | 3.7 | 4.0 | 7.2 |
|  | n8 | 5.3 | 3.0 | 4.5 | 8.4 |
|  | n9 | 2.7 | 2.8 | 4.0 | 9.5 |
|  | n10 | 2.1 | 4.2 | 4.3 | 8.6 |
|  | n11 | 3.4 | 3.6 | 3.6 | 9.1 |
|  | n12 | 0.0 | 3.6 | 5.1 | 6.7 |
|  | n13 | 3.4 | 1.7 | 5.3 | 8.0 |
|  | n14 | 3.9 | 3.8 | 5.2 | 7.9 |
|  | n15 | 3.9 | 6.3 | 4.3 | 7.5 |
|  | n16 | 2.4 | 2.6 | 3.7 | 7.3 |
|  | n17 | 3.7 | 5.1 | 3.7 | 7.0 |
|  | n18 | 2.1 | 4.3 | 4.7 | 9.8 |
|  | n19 | 4.6 | 5.4 | 4.1 | 9.1 |
|  | n20 | 3.4 | 2.4 | 5.9 | 8.4 |
| Average |  | 3.1 | 3.9 | 4.6 | 8.2 |
| Maximum |  | 5.3 | 6.3 | 5.9 | 9.8 |
| Minimum |  | 0.0 | 1.7 | 3.6 | 5.8 |
| 3σ |  | 3.9 | 3.7 | 2.1 | 3.3 |

As described in Table 5, the lead-free solder alloys of the present examples contain predetermined alloy elements within certain ranges, and thus suppress the occurrence of voids both in the region under the electrodes of the chip component and the fillet region.

Examples 35 to 46, and Comparative Examples 22 to 35

Synthesis of Acrylic Resin

A solution containing 10% by mass of methacrylic acid, 51% by mass of 2-ethylhexyl methacrylate, and 39% by mass of lauryl acrylate was prepared.

Thereafter, 200 g of diethylhexyl glycol was charged into a 500-ml four-necked flask equipped with a stirrer, a reflux pipe, and a nitrogen inlet tube, and heated to 110° C. Subsequently, 0.2% by mass to 5% by mass of dimethyl 2,2'-azobis(2-methylpropionate) (product name: V-601, Wako Pure Chemical Industries, Ltd.) as an azo radical initiator was dissolved in 300 g of the solution.

The solution was dropped to the four-necked flask over a period of 1.5 hours, the components in the four-necked flask were stirred at 110° C. for 1 hour, and the reaction was completed, thus obtaining a synthetic resin. The weight average molecular weight of the synthetic resin was 7,800 Mw, the acid value was 40 mgKOH/g, and the glass transition temperature was −47° C.

The components listed in Tables 6 and 7 were kneaded together, and thus obtaining the flux compositions of Examples 35 to 46, and Comparative Examples 22 to 35. Unless otherwise specified, the unit of the amounts in Tables 6 and 7 is % by mass.

TABLE 6

| | | | Example 35 | Example 36 | Example 37 | Example 38 | Example 39 | Example 40 | Example 41 | Example 42 | Example 43 | Example 44 | Example 45 | Example 46 |
|---|---|---|---|---|---|---|---|---|---|---|---|---|---|---|
| (A) | (A-1) | KE-604 *1 | 51 | 51 | 51 | 51 | 51 | 51 | 51 | 51 | 51 | 51 | 48 | 16 |
| | (A-2) | Acrylic resin | | | | | | | | | | | | 35 |
| (B) | (B1) | Malonic acid | 1 | 0.5 | 0.5 | 0.5 | 0.5 | 0.5 | 0.5 | 0.5 | 0.5 | 0.5 | 0.5 | 0.5 |
| | | Succinic acid | 1 | 0.5 | 0.5 | 0.5 | 0.5 | 0.5 | 0.5 | 0.5 | 0.5 | 0.5 | 0.5 | 0.5 |
| | (B2) | Glutanic acid | | 3 | | | | | | | | | | |
| | | Adipic acid | | | 3 | | | | | | | | | |
| | | Suberic acid | 3 | | | 3 | | 3 | 3 | 3 | 3 | 3 | 6 | 3 |
| | | Sebacic acid | | | | | 3 | | | | | | | |
| | | Dodecane diacid | 6 | 6 | 6 | 6 | 6 | 6 | 6 | 6 | | | 6 | 6 |
| | | Tridecane diacid | | | | | | | | | | 6 | | |
| | (B3) | Eicosane diacid | | | | | | 6 | | | | | | |
| | | 8-ethyloctadecane diacid | 6 | 6 | 6 | 6 | 6 | | | | 6 | 12 | 6 | 6 |
| | | 8,13-dimethyl-8,12-eicosadiene diacid | | | | | | | 6 | | | | | |
| | | 11-vinyl-8-octadecene diacid | | | | | | | | 6 | | | | |
| | Other | 2-bromohexanoic acid | 1.5 | 1.5 | 1.5 | 1.5 | 1.5 | 1.5 | 1.5 | 1.5 | 1.5 | 1.5 | 1.5 | 1.5 |
| (C) | | SLIPAX ZHH *2 | 4 | 4 | 4 | 4 | 4 | 4 | 4 | 4 | 4 | 4 | 4 | 4 |
| (D) | | Diethylene glycol monohexylether | 24.7 | 25.7 | 25.7 | 25.7 | 25.7 | 25.7 | 25.7 | 25.7 | 25.7 | 25.7 | 25.7 | 25.7 |
| Antioxidant | | IRGANOX 245 *3 | 1 | 1 | 1 | 1 | 1 | 1 | 1 | 1 | 1 | 1 | 1 | 1 |
| Additive | | 1,2,3-benzotriazole | 0.8 | 0.8 | 0.8 | 0.8 | 0.8 | 0.8 | 0.8 | 0.8 | 0.8 | 0.8 | 0.8 | 0.8 |

TABLE 7

| | | | Comparative Example 22 | Comparative Example 23 | Comparative Example 24 | Comparative Example 25 | Comparative Example 26 | Comparative Example 27 | Comparative Example 28 |
|---|---|---|---|---|---|---|---|---|---|
| (A) | (A-1) | KE-604 *1 | 51 | 51 | 51 | 51 | 51 | 51 | 45 |
| | (A-2) | Acrylic resin | | | | | | | |
| (B) | (B1) | Malonic acid | | 2 | 0.5 | 0.5 | 0.5 | 0.5 | 0.5 |
| | | Succinic acid | | 2 | 0.5 | 0.5 | 0.5 | 0.5 | 0.5 |
| | (B2) | Glutanic acid | | | | | | | |
| | | Adipic acid | | | | | | | |
| | | Suberic acid | 3 | 3 | 0.5 | 0.5 | 6 | 8 | 6 |
| | | Sebacic acid | | | | | | | |
| | | Dodecane diacid | 6 | 6 | 0.5 | 0.5 | 6 | 8 | 6 |
| | | Tridecane diacid | | | | | | | |
| | (B3) | Eicosane diacid | | | | | | | |
| | | 8-ethyloctadecane diacid | 6 | 6 | 1 | 12 | 1 | 6 | 16 |

TABLE 7-continued

|  |  |  |  |  |  |  |  |
|---|---|---|---|---|---|---|---|
|  | 8,13-dimethyl-8,12-eicosadiene diacid |  |  |  |  |  |  |
|  | 11-vinyl-8-octadecene diacid |  |  |  |  |  |  |
| Other | 2-bromohexanoic acid | 1.5 | 1.5 | 1.5 | 1.5 | 1.5 | 1.5 |
| (C) | SLIPAX ZHH *2 | 4 | 4 | 4 | 4 | 4 | 4 |
| (D) | Diethylene glycol monohexylether | 26.7 | 22.7 | 38.7 | 27.7 | 27.7 | 18.7 |
| Antioxidant | IRGANOX245 *3 | 1 | 1 | 1 | 1 | 1 | 1 |
| Additive | 1,2,3-benzotriazole | 0.8 | 0.8 | 0.8 | 0.8 | 0.8 | 0.8 |

|  |  |  | Comparative Example29 | Comparative Example30 | Comparative Example31 | Comparative Example32 | Comparative Example33 | Comparative Example34 | Comparative Example35 |
|---|---|---|---|---|---|---|---|---|---|
| (A) | (A-1) | KE-604 *1 | 45 | 45 | 45 | 16 | 16 | 16 | 13 |
|  | (A-2) | Acrylic resin |  |  |  | 35 | 35 | 35 | 32 |
| (B) | (B1) | Malonic acid | 0.5 | 0.5 | 0.5 |  | 2 | 0.5 | 0.5 |
|  |  | Succinic acid | 0.5 | 0.5 | 0.5 |  | 2 | 0.5 | 0.5 |
|  | (B2) | Glutaric acid |  |  |  |  |  |  |  |
|  |  | Adipic acid |  |  |  |  |  |  |  |
|  |  | Suberic acid | 6 | 6 | 6 | 3 | 3 | 8 | 6 |
|  |  | Sebacic acid |  |  |  |  |  |  |  |
|  |  | Dodecane diacid | 6 | 6 | 6 | 6 | 6 | 8 | 6 |
|  |  | Tridecane diacid |  |  |  |  |  |  |  |
|  | (B3) | Eicosane diacid | 16 |  |  |  |  |  |  |
|  |  | 8-ethyloctadecane diacid |  |  |  | 6 | 6 | 6 | 16 |
|  |  | 8,13-dimethyl-8,12-eicosadiene diacid |  | 16 |  |  |  |  |  |
|  |  | 11-vinyl-8-octadecene diacid |  |  | 16 |  |  |  |  |
| Other |  | 2-bromohexanoic acid | 1.5 | 1.5 | 1.5 | 1.5 | 1.5 | 1.5 | 1.5 |
| (C) |  | SLIPAX ZHH *2 | 4 | 4 | 4 | 4 | 4 | 4 | 4 |
| (D) |  | Diethylene glycol monohexylether | 18.7 | 18.7 | 18.7 | 18.7 | 26.7 | 22.7 | 18.7 |
| Antioxidant |  | IRGANOX245 *3 | 1 | 1 | 1 | 1 | 1 | 1 | 1 |
| Additive |  | 1,2,3-benzotriazole | 0.8 | 0.8 | 0.8 | 0.8 | 0.8 | 0.8 | 0.8 |

*1 hydrogenated acid modified rosin manufactured by Arakawa Chemical Industries, Ltd.
*2 hexamethylene bishydroxy stearic acid amide manufactured by Nippon Kasei Chemical Co., Ltd.
*3 hindered phenol antioxidant manufactured by BASF Japan Preparation of Solder Paste Composition 11.2% by mass of the flux composition was kneaded together with 88.8% by mass of any of the following solder alloy powders, thus preparing the solder paste compositions of Examples 35 to 46, and Comparative Examples 22 to 35.

Examples

Alloy (a): Sn-3Ag-0.7Cu-3.5Bi-3Sb-0.04Ni-0.01Co solder alloy
Alloy (b): Sn-3Ag-0.5Cu-4.5Bi-3Sb-0.03Ni solder alloy
Alloy (c): Sn-3Ag-0.5Cu-3.0Bi-2Sb-0.03Ni solder alloy
Alloy (d): Sn-3Ag-0.7Cu-3.2Bi-3Sb-0.03Ni-0.01Co-0.05Fe solder alloy Comparative Examples Alloy (a): Sn-3Ag-0.7Cu-3.5Bi-3Sb-0.04Ni-0.01Co solder alloy
Alloy (e): Sn-0.5Ag-0.5Cu-3.0Bi-2Sb-0.04Ni solder alloy

*All the particle sizes of the solder alloy powders were from 20 μm to 36 μm.

(5) Void Test

Test substrates were made under the same conditions as in the void test (4), and evaluated under the same conditions. The results are shown in Tables 8 and 9.

(6) Solder Ball Test

Test substrates were made under the same conditions as in the void test (4), except that, in the reflowing conditions, the peak temperature was 260° C., and the time 70 seconds at 200° C. or higher, and 60 seconds at 220° C. or higher. The surface condition of these test substrates was observed using an X-ray inspection apparatus (product name: SMX-160E, Shimadzu Co., Ltd.), the number of solder balls appeared around and on the bottom surface of the chip components, and evaluated as follows. The results are shown in Tables 8 and 9, respectively.

⊙: 0 ball appeared around the 2.0 mm×1.2 mm chip resistance 10

○: more than 0 and 5 or less balls appeared around the 2.0 mm×1.2 mm chip resistance 10

Δ: more than 5 and 10 or less balls appeared around the 2.0 mm×1.2 mm chip resistance 10 x: more than 10 balls appeared around the 2.0 mm×1.2 mm chip resistance 10

(7) Copper Plate Corrosion Test

A test was carried out according to the conditions defined in JIS Z 3284 (1994), and evaluated as follows. The results are shown in Tables 8 and 9.

○: No color change occurred on the Cu plate.

x: Color change occurred on the Cu plate.

(8) Printability Test

A glass epoxy substrate having a solder resist with a pattern on which 100-pin 0.5 mm pitch BGA is mountable and an electrode (diameter: 0.25 mm), and a metal mask having thickness 120 μm with the same pattern were provided.

The solder paste compositions were continuously printed on six each of the glass epoxy substrates using the metal mask, and the transfer volume ratio at the diameter of 0.25 mm was evaluated using an image tester (product name: aspire 2, Koh Young Technology, Inc.) based on the following criteria. The results are shown in Tables 8 and 9.

⊙: The number of pieces with a transfer volume ratio of 35% or less was 0.

○: The number of pieces with a transfer volume ratio of 35% or less was more than 0 and 10 or less.

Δ: The number of pieces with a transfer volume ratio of 35% or less was more than 10 and 50 or less.

x: The number of pieces with a transfer volume ratio of 35% or less was more than 50.

(9) Solder Cracking Test

A glass epoxy substrate including a chip component of 3.2 mm×1.6 mm, a solder resist with a pattern on which a chip component of the above-described size is mountable, and an electrode (1.6 mm×1.2 mm) for connecting the chip component, and a metal mask having the same pattern and a thickness of 150 μm were provided.

The solder paste compositions were printed on the glass epoxy substrates using the metal mask, the chip component was mounted on each of them, and thus solder joints were formed. The reflow conditions were as follows: preheating was carried out for 110 seconds in the temperature range from 170° C. to 190° C.; the peak temperature was 245° C.; the preheating time was 65 seconds at 200° C. or higher, and 45 seconds at 220° C. or higher; the cooling rate from the peak temperature to 200° C. was from 3° C. to 8° C./second; and the oxygen concentration was set at 1500±500 ppm.

The glass epoxy substrates after formation of the solder joints were exposed to the environment repeating 1,000, 2,000, and 3,000 cycles of thermal shock cycles using a liquid tank type heat shock tester (product name: ETAC WINTECH LT80, Kusumoto Chemicals, Ltd.) adjusted at the temperature range from −40° C. (5 minutes) to 150° C. (5 minutes), whereby test substrates were made.

Subsequently, the object portion of the test substrates were cut out, and sealed using an epoxy resin (product name: EPOMOUNT (main agent and curing agent), Refine Tec Ltd.). Furthermore, the center cross sections of the chip components of the test substrates were made visible using a wet polisher (product name: TegraPol-25, Marumoto Struers K.K.), whether the crack appearing at the solder joint completely crossed the solder joint to cause rupture was observed using a scanning electron microscope (product name: TM-1000, Hitachi High-Technologies Corporation), and evaluated based on the following criteria. The results are shown in Tables 8 and 9. The number of evaluated chips in each thermal shock cycle was 10.

⊙: Up to 3,000 cycles, there was no crack completely crossing the solder joints.

○: A crack completely crossing the solder joints appeared between 2,001 and 3,000 cycles.

Δ: A crack completely crossing the solder joints appeared between 1,001 and 2,000 cycles.

x: A crack completely crossing the solder joints appeared at 1,000 cycles or less.

TABLE 8

| | | Example 35 | Example 36 | Example 37 | Example 38 | Example 39 | Example 40 | Example 41 | Example 42 | Example 43 | Example 44 | Example 45 | Example 46 |
|---|---|---|---|---|---|---|---|---|---|---|---|---|---|
| Alloy (a) | (5) Void test (under electrode) | ○ | ○ | ○ | ○ | ○ | ○ | ○ | ○ | ○ | ○ | ○ | ○ |
| | (5) Void test (filet) | ⊙ | ⊙ | ⊙ | ⊙ | ○ | ○ | ○ | ○ | ⊙ | ○ | ⊙ | ⊙ |
| | (6) Solder ball test | ⊙ | ⊙ | ⊙ | ⊙ | ○ | ⊙ | ⊙ | ⊙ | ⊙ | ○ | ⊙ | ⊙ |
| | (7) Copper plate corrosion test | ○ | ○ | ○ | ○ | ○ | ○ | ○ | ○ | ○ | ○ | ○ | ○ |
| | (8) Printability test | ⊙ | ⊙ | ⊙ | ⊙ | ⊙ | Δ | ⊙ | ⊙ | ⊙ | ⊙ | ○ | ⊙ |
| | (9) Solder crack test | ○ | ○ | ○ | ○ | Δ | Δ | Δ | Δ | ○ | Δ | ○ | ○ |
| Alloy (b) | (5) Void test (under electrode) | ○ | ○ | ○ | ○ | ○ | ○ | ○ | ○ | ○ | ○ | ○ | ○ |
| | (5) Void test (filet) | ⊙ | ⊙ | ⊙ | ⊙ | ○ | ○ | ○ | ○ | ⊙ | ○ | ⊙ | ⊙ |
| | (6) Solder ball test | ○ | ○ | ○ | ○ | ○ | ○ | ○ | ○ | ○ | ○ | ○ | ○ |
| | (7) Copper plate corrosion test | ○ | ○ | ○ | ○ | ○ | ○ | ○ | ○ | ○ | ○ | ○ | ○ |
| | (8) Printability test | ⊙ | ⊙ | ⊙ | ⊙ | ○ | Δ | ⊙ | ⊙ | ⊙ | ⊙ | ○ | ⊙ |
| | (9) Solder crack test | ⊙ | ⊙ | ⊙ | ⊙ | ○ | ○ | ○ | ○ | ⊙ | ○ | ⊙ | ⊙ |

TABLE 8-continued

|  |  | Example 35 | Example 36 | Example 37 | Example 38 | Example 39 | Example 40 | Example 41 | Example 42 | Example 43 | Example 44 | Example 45 | Example 46 |
|---|---|---|---|---|---|---|---|---|---|---|---|---|---|
| Alloy (c) | (5) Void test (under electrode) | ○ | ○ | ○ | ○ | ○ | ○ | ○ | ○ | ○ | ○ | ○ | ○ |
|  | (5) Void test (filet) | ○ | ○ | ○ | ○ | Δ | Δ | Δ | Δ | ○ | Δ | ○ | ○ |
|  | (6) Solder ball test | ○ | ○ | ○ | ○ | ○ | ○ | ○ | ○ | ○ | ○ | ○ | ○ |
|  | (7) Copper plate corrosion test | ○ | ○ | ○ | ○ | ○ | ○ | ○ | ○ | ○ | ○ | ○ | ○ |
|  | (8) Printability test | ⊙ | ⊙ | ⊙ | ⊙ | ⊙ | Δ | ⊙ | ⊙ | ⊙ | ⊙ | ○ | ⊙ |
|  | (9) Solder crack test | ○ | ○ | ○ | ○ | Δ | Δ | Δ | Δ | ○ | Δ | ○ | ○ |
| Alloy (d) | (5) Void test (under electrode) | ○ | ○ | ○ | ○ | Δ | Δ | Δ | Δ | ○ | Δ | ○ | ○ |
|  | (5) Void test (filet) | ○ | ○ | ○ | ○ | ○ | ○ | ○ | ○ | ○ | ○ | ○ | ○ |
|  | (6) Solder ball test | ⊙ | ⊙ | ⊙ | ⊙ | ○ | ⊙ | ⊙ | ⊙ | ⊙ | ○ | ⊙ | ⊙ |
|  | (7) Copper plate corrosion test | ○ | ○ | ○ | ○ | ○ | ○ | ○ | ○ | ○ | ○ | ○ | ○ |
|  | (8) Printability test | ⊙ | ⊙ | ⊙ | ⊙ | ⊙ | Δ | ⊙ | ⊙ | ⊙ | ⊙ | ○ | ⊙ |
|  | (9) Solder crack test | ○ | ○ | ○ | ○ | ○ | ○ | ○ | ○ | ○ | ○ | ○ | ○ |

TABLE 9

|  |  | Comparative Example 22 | Comparative Example 23 | Comparative Example 24 | Comparative Example 25 | Comparative Example 26 | Comparative Example 27 | Comparative Example 28 |
|---|---|---|---|---|---|---|---|---|
| Alloy (a) | (5) Void test (under electrode) | ○ | ○ | Δ | Δ | Δ | ○ | ○ |
|  | (5) Void test (filet) | ○ | ⊙ | Δ | Δ | Δ | ⊙ | ⊙ |
|  | (6) Solder ball test | X | ⊙ | X | X | ⊙ | ⊙ | ⊙ |
|  | (7) Copper plate corrosion test | ○ | X | ○ | ○ | ○ | X | X |
|  | (8) Printability test | ⊙ | ○ | ⊙ | ⊙ | ⊙ | Δ | Δ |
|  | (9) Solder crack test | Δ | ○ | Δ | Δ | Δ | ○ | ○ |
| Alloy (b) | (5) Void test (under electrode) | Δ | Δ | Δ | Δ | Δ | Δ | Δ |
|  | (5) Void test (filet) | Δ | ○ | Δ | Δ | Δ | ○ | ○ |
|  | (6) Solder ball test | X | ⊙ | X | X | ⊙ | ⊙ | ⊙ |
|  | (7) Copper plate corrosion test | ○ | X | ○ | ○ | ○ | X | X |
|  | (8) Printability test | ⊙ | ○ | ⊙ | ⊙ | ⊙ | Δ | Δ |
|  | (9) Solder crack test | X | X | X | X | X | X | X |

|  |  | Comparative Example 29 | Comparative Example 30 | Comparative Example 31 | Comparative Example 32 | Comparative Example 33 | Comparative Example 34 | Comparative Example 35 |
|---|---|---|---|---|---|---|---|---|
| Alloy (a) | (5) Void test (under electrode) | ○ | ○ | ○ | ○ | ○ | ○ | ○ |
|  | (5) Void test (filet) | ⊙ | ⊙ | ⊙ | ○ | ⊙ | ⊙ | ⊙ |
|  | (6) Solder ball test | ⊙ | ⊙ | ⊙ | X | ⊙ | ○ | ○ |
|  | (7) Copper plate corrosion test | X | X | X | X | X | X | X |
|  | (8) Printability test | X | Δ | Δ | ⊙ | ○ | Δ | Δ |
|  | (9) Solder crack test | ○ | ○ | ○ | Δ | ○ | ○ | ○ |
| Alloy (b) | (5) Void test (under electrode) | Δ | Δ | Δ | Δ | Δ | Δ | Δ |
|  | (5) Void test (filet) | ○ | ○ | ○ | Δ | ○ | ○ | ○ |
|  | (6) Solder ball test | ⊙ | ⊙ | ⊙ | X | ⊙ | ○ | ○ |
|  | (7) Copper plate corrosion test | X | X | X | ○ | X | X | X |
|  | (8) Printability test | X | Δ | Δ | ⊙ | ○ | Δ | Δ |
|  | (9) Solder crack test | X | X | X | X | X | X | X |

The solder paste compositions of Examples 35 to 46 contain, in addition to the lead-free solder alloy which suppresses void occurrence and achieves good crack development suppressing effect in the solder joints to be formed, specific amounts of activators (B-1), (B-2), and (B-3), which are dicarboxylic acids corresponding to specific carbon number ranges, in the flux composition. Therefore, they exert good oxidation reduction action on solder alloys, and more sufficiently remove the surface oxide film from the lead-free solder alloy powder. Therefore, residence of voids in solder joints is further suppressed, and crack development in the solder joints is further suppressed, even in environments subjected to temperature variations and vibration loads, particularly severe temperature variations from −40°

C. to 150° C. In addition, the solder paste composition suppresses the occurrence of solder balls caused by difficulty in flocculation and coalescence of alloy powders, and exerts good printability.

The lead-free solder alloy and solder paste composition of the present embodiment are suitable for the use in electronic circuit boards required to have high reliability, such as in-car electronic circuit boards. Furthermore, these electronic circuit boards are suitable for the use in electronic controllers required to have high reliability.

When the solder alloy contains Bi, Bi enters into the lattices of the atomic arrangement of the solder alloy, and substitutes Sn, thereby distorting the lattices of the atomic arrangement. This reinforces the Sn matrix to improve the alloy strength, so that it is expected that the addition of Bi will achieve certain improvement in the solder crack development properties.

However, there are demerits that the lead-free solder alloy strengthened by the addition of Bi deteriorates in drawability, and increases in brittleness. When the applicant solder-bonded a substrate and a chip resistor component using a related art lead-free solder alloy containing Bi, and placed it in an endowment exposed to extreme temperature variations, a crack linearly occurred in the fillet portion at the chip resistor component side, in a direction at about 45° to the longitudinal direction of the chip resistor component, and electrical short circuit occurred. Accordingly, related art strengthening alone cannot achieve sufficient crack development suppressing effect particularly for in-car substrates placed in environments with extreme temperature variations, so that the development of a new method for suppressing crack development in combination with strengthening is desired.

In addition, the solidus temperature-liquidus temperature of the Sn-3Ag-0.5Cu solder alloy are about 40° C. higher than those of related art Sn—Pb eutectic solder, and the Sn-3Ag-0.5Cu solder alloy contains Cu having high viscosity. Therefore, particularly in a solder paste composition, if the flux composition cannot thoroughly remove the oxide film of the solder alloy powder, voids readily occur during solder bonding, and voids can readily remain in the formed solder joints.

In particular, when the Sn—Ag—Cu solder alloy contains a highly oxidative element such as Bi, In, or Sb, thorough removal of the surface oxide film of the alloy powder tends to be more difficult than the case using the Sn-3Ag-0.5Cu solder alloy. Therefore, particularly in a solder paste composition, if the activity of the flux composition to be used is insufficient, the viscosity of the molten alloy powder is hard to decrease and thus voids tend to remain in the solder joints, whereby flocculation and coalescence of the alloy powders are hindered, and solder balls readily occur. Solder balls can cause fusion failures between the solder paste composition and the electrodes of the electric components implemented on the substrate which can result in open failures and shorting, so that suppression of the occurrence of solder balls is one of important problems for in-car electronic circuit boards which are required to have high reliability.

In addition, for example, when voids occur in the vicinity of interfaces of solder joints, the electronic components can be readily bonded to the substrate in an asymmetrical state (the thickness of the solder joints located over the electrodes and under the lower electrodes of electric components on the substrate are uneven). Therefore, of the solder joints, the less thick (thin) portion has a further shorter bonding life. Such solder joints are readily cracked from the thin portion particularly in environments with extreme temperature variations, and the cracks readily develop.

Furthermore, when voids occur in the fillets of the solder joints, the volume and crack channels of the voids become shorter than those of the solder joints having no void in the fillets, which can promote the occurrence of cracks crossing the solder joints.

An activator having high activity may be added for preventing the occurrence of solder balls, but such activator readily reacts during mixing of the alloy powder and flux composition, so that most part of the activator can volatilize during preheating or in the course of reflowing. In order to prevent such situation, a large amount the activator may be added to the flux composition, but the addition of such a large amount of the activator can inhibit printability of the solder paste composition.

In addition, as described above, the solder paste composition including a highly oxidative solder alloy powder tends to develop voids in the solder joints. These voids can result in crack development in the solder joints in environments subjected to extreme temperature variations, and thus can deteriorate reliability of the electronic circuit board.

Furthermore, when solder bonding is carried out using electronic components without Ni/Pd/Au plating or Ni/Au plating, the $Cu_3Sn$ layer as an intermetallic compound largely grows in an uneven state in the vicinity of interfaces, so that suppression of crack development in the vicinity of interfaces is difficult.

(1) A lead-free solder alloy includes 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, and 0.01% by mass or more and 0.25% by mass or less of Ni, the balance being composed of Sn.

(2) In the configuration according to (1), the lead-free solder alloy further includes 0.001% by mass or more and 0.25% by mass or less of Co.

(3) In the lead-free solder alloy according to (2), the amount of Sb is 2% by mass to 4% by mass, and the amount of Bi is 3.1% by mass to 3.2% by mass.

(4) In the lead-free solder alloy according to (2), the amount of Cu is 0.7% by mass to 1% by mass.

(5) A lead-free solder alloy includes 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, 0.001% by mass or more and 0.25% by mass or less of Co, the balance being composed of Sn, the amount of Ag, Cu, Sb, Bi, Ni, and Co (% by mass) satisfying all the formulae (A) to (D):

$$1.6 \leq \text{the amount of Ag} + (\text{the amount of Cu}/0.5) \leq 5.9 \quad (A)$$

$$0.85 \leq (\text{the amount of Ag}/3) + (\text{the amount of Bi}/4.5) \leq 2.10 \quad (B)$$

$$3.6 \leq \text{the amount of Ag} + \text{the amount of Sb} \leq 8.9 \quad (C)$$

$$0 < (\text{the amount of Ni}/0.25) + (\text{the amount of Co}/0.25) \leq 1.19 \quad (D).$$

(6) In the configuration according to any one of (1) to (5), the lead-free solder alloy further includes more than 0% by mass and 6% by mass or less of In.

(7) In the configuration according to any one of (1) to (6), the lead-free solder alloy further includes at least one of P, Ga, and Ge in a total amount of 0.001% by mass or more and 0.05% by mass or less.

(8) In the configuration according to any one of (1) to (7), the lead-free solder alloy further includes at least one of Fe, Mn, Cr, and Mo in a total amount of 0.001% by mass or more and 0.05% by mass or less.

(9) A solder paste composition includes the powder of the lead-free solder alloy of any one of (1) to (8), and a flux composition containing a base resin (A), an activator (B), a thixotropic agent (C), and a solvent (D).

(10) In the configuration according to (9), in the flux composition, the amount of the activator (B) is 4.5% by mass or more and 35% by mass or less with reference to the total amount of the flux composition, and the activator (B) is composed of a linear saturated dicarboxylic acid (B-1) having 3 to 4 carbon atoms in an amount of 0.5% by mass or more and 3% by mass or less with reference to the total amount of the flux composition, a dicarboxylic acid (B-2) having 5 to 13 carbon atoms in an amount of 2% by mass or more and 15% by mass or less with reference to the total amount of the flux composition, and a dicarboxylic acid (B-3) having 20 to 22 carbon atoms in an amount of 2% by mass or more and 15% by mass or less with reference to the total amount of the flux composition.

(11) In the configuration according to (10), the linear saturated dicarboxylic acid (B-1) having 3 to 4 carbon atoms is malonic acid and/or succinic acid, the dicarboxylic acid (B-2) having 5 to 13 carbon atoms is at least one selected from glutaric acid, adipic acid, pimelic acid, suberic acid, azelaic acid, 2-methylazelaic acid, sebacic acid, undecanedioic acid, 2,4-dimethyl-4-methoxycarbonyl undecanedioic acid, dodecanedioic acid, tridecane diacid, and 2,4,6-trimethyl-4,6-dimethoxycarbonyl tridecane diacid, and the dicarboxylic acid (B-3) having 20 to 22 carbon atoms is at least one selected from eicosane diacid, 8-ethyl octadecane dioic acid, 8,13-dimethyl-8,12-eicosadiene diacid, and 11-vinyl-8-octadecene diacid.

(12) An electronic circuit board has a solder joint formed using the lead-free solder alloy according to any one of (1) to (8).

(13) An electronic circuit board has a solder joint formed using the solder paste composition according to any one of (9) to (11).

(14) An electronic controller has the electronic circuit board according to (12) or (13).

(15) A lead-free solder alloy consists of 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, Sn and unavoidable impurities.

(16) A lead-free solder alloy consists of 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, 0.001% by mass or more and 0.25% by mass or less of Co, Sn and unavoidable impurities.

(17) In the lead-free solder alloy according to (16), the amount of Sb is 2% by mass to 4% by mass, and the amount of Bi is 3.1% by mass to 3.2% by mass.

(18) In the lead-free solder alloy according to (16), the amount of Cu is 0.7% by mass to 1% by mass.

(19) A lead-free solder alloy consists of 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, 0.001% by mass or more and 0.25% by mass or less of Co, Sn, and the amount of Ag, Cu, Sb, Bi, Ni, and Co (% by mass) satisfying all the formulae (A) to (D):

$$1.6 \leq \text{the amount of Ag} + (\text{the amount of Cu}/0.5) \leq 5.9 \quad (A)$$

$$0.85 \leq (\text{the amount of Ag}/3) + (\text{the amount of Bi}/4.5) \leq 2.10 \quad (B)$$

$$3.6 \leq \text{the amount of Ag} + \text{the amount of Sb} \leq 8.9 \quad (C)$$

$$0 < (\text{the amount of Ni}/0.25) + (\text{the amount of Co}/0.25) \leq 1.19 \quad (D).$$

(20) A lead-free solder alloy consists of 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, more than 0% by mass and 6% by mass or less of In, Sn and unavoidable impurities.

(21) A lead-free solder alloy consists of 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, 0.001% by mass or more and 0.25% by mass or less of Co, more than 0% by mass and 6% by mass or less of In, Sn and unavoidable impurities.

(22) A lead-free solder alloy consists of 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, at least one of P, Ga, and Ge in a total amount of 0.001% by mass or more and 0.05% by mass or less, Sn and unavoidable impurities.

(23) A lead-free solder alloy consists of 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, 0.001% by mass or more and 0.25% by mass or less of Co, at least one of P, Ga, and Ge in a total amount of 0.001% by mass or more and 0.05% by mass or less, Sn and unavoidable impurities.

(24) A lead-free solder alloy consists of 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, 0.001% by mass or more and 0.25% by mass or less of Co, more than 0% by mass and 6% by mass or less of In, at least one of P, Ga, and Ge in a total amount of 0.001% by mass or more and 0.05% by mass or less, Sn and unavoidable impurities.

(25) A lead-free solder alloy consists of 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, at least one of Fe, Mn, Cr, and Mo in a total amount of 0.001% by mass or more and 0.05% by mass or less, Sn and unavoidable impurities.

(26) A lead-free solder alloy consists of 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, 0.001% by mass or more and 0.25% by mass or less of Co, at least one of Fe, Mn, Cr, and Mo in a total amount of 0.001% by mass or more and 0.05% by mass or less, Sn and unavoidable impurities.

(27) A lead-free solder alloy consists of 2% by mass or more and 3.1% by mass or less of Ag, more than 0% by mass and 1% by mass or less of Cu, 1% by mass or more and 5% by mass or less of Sb, 3.1% by mass or more and 4.5% by mass or less of Bi, 0.01% by mass or more and 0.25% by mass or less of Ni, 0.001% by mass or more and 0.25% by mass or less of Co, more than 0% by mass and 6% by mass or less of In, at least one of Fe, Mn, Cr, and Mo in a total amount of 0.001% by mass or more and 0.05% by mass or less, Sn and unavoidable impurities.

(28) A solder paste composition includes the powder of the lead-free solder alloy of any one of (15) to (27), and a flux composition containing a base resin (A), an activator (B), a thixotropic agent (C), and a solvent (D).

(29) In the configuration according to (28), in the flux composition, the amount of the activator (B) is 4.5% by mass or more and 35% by mass or less with reference to the total amount of the flux composition, and the activator (B) is composed of a linear saturated dicarboxylic acid (B-1) having 3 to 4 carbon atoms in an amount of 0.5% by mass or more and 3% by mass or less with reference to the total amount of the flux composition, a dicarboxylic acid (B-2) having 5 to 13 carbon atoms in an amount of 2% by mass or more and 15% by mass or less with reference to the total amount of the flux composition, and a dicarboxylic acid (B-3) having 20 to 22 carbon atoms in an amount of 2% by mass or more and 15% by mass or less with reference to the total amount of the flux composition.

(30) In the configuration according to (29), the linear saturated dicarboxylic acid (B-1) having 3 to 4 carbon atoms is malonic acid and/or succinic acid, the dicarboxylic acid (B-2) having 5 to 13 carbon atoms is at least one selected from glutaric acid, adipic acid, pimelic acid, suberic acid, azelaic acid, 2-methylazelaic acid, sebacic acid, undecanedioic acid, 2,4-dimethyl-4-methoxycarbonyl undecanedioic acid, dodecanedioic acid, tridecane diacid, and 2,4,6-trimethyl-4,6-dimethoxycarbonyl tridecane diacid, and the dicarboxylic acid (B-3) having 20 to 22 carbon atoms is at least one selected from eicosane diacid, 8-ethyl octadecane dioic acid, 8,13-dimethyl-8,12-eicosadiene diacid, and 11-vinyl-8-octadecene diacid.

(31) An electronic circuit board has a solder joint formed using the lead-free solder alloy according to any one of (15) to (27).

(32) An electronic circuit board has a solder joint formed using the solder paste composition according to any one of (28) to (30).

(33) An electronic controller has the electronic circuit board according to (31) or (32).

The lead-free solder alloy can suppress crack development in solder joints formed using the alloy even in severe environments subjected to extreme temperature variations and vibration loads, and suppresses crack development in the vicinity of interfaces even when solder bonding is carried out using electronic components without Ni/Pd/Au plating or Ni/Au plating. In addition, the solder paste composition further suppresses the occurrence of voids in solder joints even when a solder alloy powder containing a highly oxidative alloy element is used, thereby further suppressing crack development in the solder joints, and achieves good printability while suppressing the occurrence of solder balls.

Obviously, numerous modifications and variations of the present invention are possible in light of the above teachings. It is therefore to be understood that within the scope of the appended claims, the invention may be practiced otherwise than as specifically described herein.

What is claimed is:
1. A lead-free solder alloy consisting of:
2% by mass or more and 3.1% by mass or less of Ag;
more than 0% by mass and 1% by mass or less of Cu;
2% by mass or more and 5% by mass or less of Sb;
3.1% by mass or more and 4.5% by mass or less of Bi;
0.01% by mass or more and 0.03% by mass or less of Ni;
more than 0.008% by mass and 0.1% by mass or less of Co;
optionally 0.001% by mass or more and 0.05% by mass or less of at least one of P, Ga, and Ge;
optionally 0.001% by mass or more and 0.05% by mass or less of at least one of Fe, Mn, Cr, and Mo; and
Sn.

2. The lead-free solder alloy according to claim 1, wherein an amount of Sb is 2% by mass to 4% by mass, and the amount of Bi is 3.1% by mass to 3.2% by mass.

3. The lead-free solder alloy according to claim 1, wherein an amount of Cu is 0.7% by mass to 1% by mass.

4. The lead-free solder alloy according to claim 1, wherein an amount of Cu is 0.7% by mass.

5. A solder paste composition comprising:
a powder of the lead-free solder alloy according to claim 1; and
a flux composition containing a base resin (A), an activator (B), a thixotropic agent (C), and a solvent (D).

6. The solder paste composition according to claim 5, wherein in the flux composition, the amount of the activator (B) is 4.5% by mass or more and 35% by mass or less with reference to the total amount of the flux composition, and
the activator (B) is composed of a linear saturated dicarboxylic acid (B-1) having 3 to 4 carbon atoms in an amount of 0.5% by mass or more and 3% by mass or less with reference to the total amount of the flux composition, a dicarboxylic acid (B-2) having 5 to 13 carbon atoms in an amount of 2% by mass or more and 15% by mass or less with reference to the total amount of the flux composition, and a dicarboxylic acid (B-3) having 20 to 22 carbon atoms in an amount of 2% by mass or more and 15% by mass or less with reference to the total amount of the flux composition.

7. The solder paste composition according to claim 6, wherein the linear saturated dicarboxylic acid (B-1) having 3 to 4 carbon atoms is malonic acid and/or succinic acid,
the dicarboxylic acid (B-2) having 5 to 13 carbon atoms is at least one selected from glutaric acid, adipic acid, pimelic acid, suberic acid, azelaic acid, 2-methylazelaic acid, sebacic acid, undecanedioic acid, 2,4-dimethyl-4-methoxycarbonyl undecanedioic acid, dodecanedioic acid, tridecane diacid, and 2,4,6-trimethyl-4,6-dimethoxycarbonyl tridecane diacid, and
the dicarboxylic acid (B-3) having 20 to 22 carbon atoms is at least one selected from eicosane diacid, 8-ethyl octadecane dioic acid, 8,13-dimethyl-8,12-eicosadiene diacid, and 11-vinyl-8-octadecene diacid.

8. An electronic circuit board comprising a solder joint to joint an electronic component with the lead-free solder alloy according to claim 1.

9. An electronic circuit board comprising a solder joint containing the solder paste composition according to claim 5.

10. An electronic device comprising the electronic circuit board according to claim 8.

11. The lead-free solder alloy of claim 1, wherein the mass ratio of Ni content relative to Co content is 1 or more and 3.75 or less.

12. A lead-free solder alloy consisting of:
2% by mass or more and 3.1% by mass or less of Ag;
more than 0% by mass and 1% by mass or less of Cu;
2% by mass or more and 5% by mass or less of Sb;
3.1% by mass or more and 4.5% by mass or less of Bi;
0.01% by mass or more and 0.03% by mass or less of Ni;
more than 0.008% by mass and 0.1% by mass or less of Co;
optionally 0.001% by mass or more and 0.05% by mass or less of at least one of P, Ga, and Ge;
optionally 0.001% by mass or more and 0.05% by mass or less of at least one of Fe, Mn, Cr, and Mo; and
Sn,
wherein inequalities (A) to (D) in terms of % by weight are satisfied, $$3 \leq \text{an amount of Ag} + (\text{an amount of Cu}/0.5) \leq 5.1 \quad (A);$$

$$3.69 \leq (\text{an amount of Ag}/3) + (\text{an amount of Bi}/4.5) \leq 2.03 \quad (B);$$

$$5 \leq \text{an amount of Ag} + \text{an amount of Sb} \leq 8.1 \quad (C); \text{ and}$$

$$0.072 \leq (\text{an amount of Ni}/0.25) + (\text{an amount of Co}/0.25) \leq 0.52 \quad (D).$$

13. The lead-free solder alloy of claim 12, wherein the mass ratio of Ni content relative to Co content is 1 or more and 3.75 or less.

14. A solder joint formed by using a lead-free solder alloy to electrically connect electrodes, the lead-free solder alloy consisting of:
2% by mass or more and 3.1% by mass or less of Ag;
more than 0% by mass and 1% by mass or less of Cu;
2% by mass or more and 5% by mass or less of Sb;
3.1% by mass or more and 4.5% by mass or less of Bi;
0.01% by mass or more and 0.03% by mass or less of Ni;
more than 0.008% by mass and 0.1% by mass or less of Co;
optionally 0.001% by mass or more and 0.05% by mass or less of at least one of P, Ga, and Ge;
optionally 0.001% by mass or more and 0.05% by mass or less of at least one of Fe, Mn, Cr, and Mo; and
Sn.

15. The solder joint of claim 14, wherein the mass ratio of Ni content relative to Co content is 1 or more and 3.75 or less.

16. A lead-free solder alloy consisting of:
2% by mass or more and 3.1% by mass or less of Ag;
more than 0% by mass and 1% by mass or less of Cu;
2% by mass or more and 5% by mass or less of Sb;
3.1% by mass or more and 4.5% by mass or less of Bi;
0.01% by mass or more and 0.03% by mass or less of Ni;
more than 0.008% by mass and 0.1% by mass or less of Co;
Sn; and
unavoidable impurities.

17. The lead-free solder alloy of claim 16, wherein the mass ratio of Ni content relative to Co content is 1 or more and 3.75 or less.

* * * * *